US012719513B2

(12) United States Patent
Hamid et al.

(10) Patent No.: US 12,719,513 B2
(45) Date of Patent: Aug. 25, 2026

(54) SYSTEMS AND METHODS FOR MULTIBAND LINEARIZATION ARCHITECTURE USING KERNEL REGRESSION

(71) Applicant: Telefonaktiebolaget LM Ericsson (publ), Stockholm (SE)

(72) Inventors: Mohamed Hamid, Malmö (SE); Ashim Biswas, Sollentuna (SE); Shoaib Amin, Kumla (SE); Per Landin, Kumla (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 232 days.

(21) Appl. No.: 18/571,315

(22) PCT Filed: Jun. 18, 2021

(86) PCT No.: PCT/EP2021/066542

§ 371 (c)(1),
(2) Date: Dec. 18, 2023

(87) PCT Pub. No.: WO2022/262991

PCT Pub. Date: Dec. 22, 2022

(65) Prior Publication Data

US 2024/0291508 A1 Aug. 29, 2024

(51) Int. Cl.
*H04B 1/04* (2006.01)
*H03F 1/32* (2006.01)
*H03F 3/189* (2006.01)

(52) U.S. Cl.
CPC ............. *H04B 1/04* (2013.01); *H03F 1/3247* (2013.01); *H03F 3/189* (2013.01);
(Continued)

(58) Field of Classification Search
CPC . H04B 1/04; H04B 2001/0425; H03F 1/3247; H03F 3/189; H03F 2200/451; H03F 2201/3233
(Continued)

(56) References Cited

U.S. PATENT DOCUMENTS 5,465,321 A * 11/1995 Smyth ................. G06F 11/2257 706/20
10,063,265 B2 8/2018 Pratt et al.
(Continued)

FOREIGN PATENT DOCUMENTS

WO 2017198288 A1 11/2017
WO 2020187384 A1 9/2020

OTHER PUBLICATIONS

Abdelhafiz, et al., "A High-Performance Complexity Reduced Behavioral Model and Digital Predistorter for MIMO Systems With Crosstalk," IEEE Transactions on Communications, vol. 64, Issue 5, May 2016, pp. 1996-2004.
(Continued)

*Primary Examiner* — Kevin M Burd
(74) *Attorney, Agent, or Firm* — Withrow & Terranova, PLLC

(57) ABSTRACT

Systems and methods for multiband linearization using kernel regression are provided. In some embodiments, a method includes, for each band of the multiband transmitter: transforming a group of input signals from one or more bands into a constructed input vector space to provide transformed input signals; predistorting the transformed input signals to provide a respective group of predistorted input signals in accordance with a Radial Basis Function (RBF) kernel regression; and transmitting the respective group of predistorted input signals. In this way, some advantages include a semi blind approach as one need not to account for the non-linearity order as in Volterra-based DPD
(Continued)

for example, only the memory depth is needed to be incorporated to the input vector space. The computational complexity of DPD is reduced compared to Volterra-based DPD. Implementation complexity is relaxed by means of using a 1D Lookup Table implementation regardless of the number of bands.

19 Claims, 17 Drawing Sheets

(52) U.S. Cl.
CPC .................. *H03F 2200/451* (2013.01); *H03F 2201/3233* (2013.01); *H04B 2001/0425* (2013.01)

(58) Field of Classification Search
USPC .......................................................... 375/296
See application file for complete search history.

(56) References Cited

U.S. PATENT DOCUMENTS

| | | | | |
|---|---|---|---|---|
| 10,673,475 | B1 * | 6/2020 | Zhuo | H04B 7/0617 |
| 11,228,379 | B1 | 1/2022 | O'Shea | |
| 2011/0063026 | A1 * | 3/2011 | Jung | H03F 3/24 330/149 |
| 2013/0343483 | A1 * | 12/2013 | Bai | H03F 1/3247 375/297 |
| 2014/0036969 | A1 | 2/2014 | Wyville et al. | |
| 2015/0324441 | A1 * | 11/2015 | Zhou | G06F 16/285 707/737 |
| 2016/0241277 | A1 | 8/2016 | Rexberg et al. | |
| 2017/0047954 | A1 | 2/2017 | Tian et al. | |
| 2018/0167091 | A1 | 6/2018 | Pratt et al. | |
| 2018/0167092 | A1 | 6/2018 | Hausmair et al. | |
| 2018/0316367 | A1 | 11/2018 | Johansson et al. | |
| 2019/0068133 | A1 * | 2/2019 | Gutman | H04L 27/368 |
| 2019/0312613 | A1 | 10/2019 | Guan | |
| 2020/0186103 | A1 | 6/2020 | Weber et al. | |
| 2020/0272772 | A1 * | 8/2020 | Kawai | G06F 11/3006 |
| 2021/0367564 | A1 | 11/2021 | Hausmair et al. | |

OTHER PUBLICATIONS

Abu-Mostafa, et al., "Learning From Data: A Short Course," AMLBook.com, Chapter 3, Nonlinear Transformation, 2012, pp. 99-104.
Amin, et al., "Behavioral Modeling and Linearization of Crosstalk and Memory Effects in RF MIMO Transmitters," IEEE Transactions on Microwave Theory and Techniques, vol. 62, Issue 4, Apr. 2014, pp. 810-823.
Barradas, et al., "Digital Predistortion of RF PAs for MIMO Transmitters Based on the Equivalent Load," International Workshop on Integrated Nonlinear Microwave and Millimetre-Wave Circuits, Apr. 20-21, 2017, Graz, Austria, 4 pages.
Bassam, et al., "Crossover Digital Predistorter for the Compensation of Crosstalk and Nonlinearity in MIMO Transmitters," IEEE Transactions on Microwave Theory Techniques, vol. 57, Issue 5, May 2009, pp. 1119-1128.
Becerra, et al., "Efficient linearization of a RF Transmitter under 5G waveforms through Iterated Ridge Regression," Microwave Measurement Conference, Jun. 15, 2018, Philadelphia, Pennsylvania, IEEE, 4 pages.
Bishop, Christopher, "Pattern Recognition and Machine Learning," book, 2006, Springer, 758 pages.
Chani-Cahuana, et al., "Iterative Learning Control for RF Power Amplifier Linearization," IEEE Transactions on Microwave Theory and Techniques, vol. 64, Issue 9, Sep. 2016, pp. 2278-2789.
Eun, et al., "A New Volterra Predistorter Based on the Indirect Learning Architecture," IEEE Transactions on Signal Processing, vol. 45, Issue 1, Jan. 1997, pp. 223-227.
Hamid, et al., "Non-parametric Spectrum Cartography Using Adaptive Radial Basis Functions," International Conference on Acoustics, Speech, and Signal Processing, 2017, New Orleans, Louisiana, IEEE, pp. 3599-3603.
Hausmair, et al., "Prediction of Nonlinear Distortion in Wideband Active Antenna Arrays," IEEE Transactions on Microwave Theory and Techniques, vol. 65, Issue 11, Nov. 2017, pp. 4550-4563.
Hui, et al., "Augmented radial basis function neural network predistorter for linearisation of wideband power amplifiers," Electronics Letters, vol. 50, Issue 12, Jun. 5, 2014, pp. 877-879.
Isaksson, et al., "Wide-Band Dynamic Modeling of Power Amplifiers Using Radial-Basis Function Neural Networks," IEEE Transactions on Microwave Theory and Techniques, vol. 53, Issue 11, Nov. 2005, pp. 3422-3428.
Li, et al., "Iterative Learning Control Assisted Neural Network for Digital Predistortion of MIMO Power Amplifier," 87th Vehicular Technology Conference, Jun. 2018, IEEE, 5 pages.
Liu, et al., "Digital Predistortion Linearization with Deep Neural Networks for 5G Power Amplifiers," European Microwave Conference in Central Europe, May 13-15, 2019, Prague, Czech Republic, EuMA, pp. 216-219.
Lloyd, Stuart, "Least Squares Quantization in PCM," IEEE Transactions on Information Theory, vol. 28, Issue 2, Mar. 1982, pp. 129-137.
Marzetta, "Noncooperative Cellular Wireless with Unlimited Numbers of Base Station Antennas," IEEE Transactions on Wireless Communications, vol. 9, Issue 11, Nov. 2010, pp. 3590-3600.
Morgan, et al., "A Generalized Memory Polynomial Model for Digital Predistortion of RF Power Amplifiers," IEEE Transactions on Signal Processing, vol. 54, Issue 10, Oct. 2006, pp. 3852-3860.
Pozar, "Microwave Engineering," 4th Edition, Section 9.4, Ferrite Isolators, Hoboken, New Jersey, John Wiley & Sons, Inc., 2012, pp. 475-482.
Saffar, et al., "Behavioral Modeling of MIMO Nonlinear Systems With Multivariable Polynomials," IEEE Transactions on Microwave Theory and Tchniques, vol. 59, Issue 11, Nov. 2011, pp. 2994-3003.
Suryasarman, "Digital pre-distortion for multiple antenna transmitters," Doctoral Dissertation, Feb. 2015, 110 pages.
Wang, et al., "Complexity Analysis of Wideband Power Amplifiers Linearization in Multi-band Signal Transmission for Massive MIMO systems," International Microwave Symposium, Aug. 4, 2020, IEEE, pp. 960-963.
Xu, et al., "Augmented Time-Delay Twin Support Vector Regression-Based Behavioral Modeling for Digital Predistortion of RF Power Amplifier," IEEE Access, vol. 7, 2019, pp. 59832-59843.
Zenteno, et al., "Finding Structural Information About RF Power Amplifiers Using an Orthogonal Nonparametric Kernal Smoothing Estimator," IEEE Transactions on Vehicular Technology, vol. 65, Issue 5, May 2016, pp. 2883-2889.
International Search Report and Written Opinion for International Patent Application No. PCT/EP2021/066542, mailed Mar. 3, 2022, 13 pages.
International Search Report and Written Opinion for International Patent Application No. PCT/EP2019/056538, mailed Nov. 14, 2019, 13 pages.
Non-Final Office Action for U.S. Appl. No. 17/439,699, mailed Dec. 8, 2022, 13 pages.
Final Office Action for U.S. Appl. No. 17/439,699, mailed Apr. 26, 2023, 9 pages.
Advisory Action for U.S. Appl. No. 17/439,699, mailed Jul. 14, 2023, 3 pages.
Notice of Allowance and Applicant-Initiated Interview Summary for U.S. Appl. No. 17/439,699, mailed Nov. 9, 2023, 15 pages.
First Office Action for Chinese Patent Application No. 201980096313.2, mailed Sep. 22, 2023, 4 pages.

* cited by examiner (A)

(B)

(C)

SYSTEMS AND METHODS FOR MULTIBAND LINEARIZATION ARCHITECTURE USING KERNEL REGRESSION

This application is a 35 U.S.C. § 371 national phase filing of International Application No. PCT/EP2021/066542, filed Jun. 18, 2021, the disclosure of which is incorporated herein by reference in its entirety.

TECHNICAL FIELD

This disclosure relates generally to multiband linearization.

BACKGROUND

With the continuous evolvements of cellular systems, more and more frequency bands are added to meet the ever-increasing demands of higher data rates and more reliable communications. Traditionally, introducing new frequency bands implies adding extra radios to existing sites. In return, such additions increase site complexity and cost. Therefore, a radio, referred to as multiband radio, can transmit in different bands simultaneously and would facilitate adopting newly added bands while satisfying site constraints.

The radio design for multiband radios comes with several challenges, and in particular the challenges of non-linear distortion mitigation caused by Power Amplifier (PA) behavior where conventional algorithms of single band linearization do not scale with the number of bands. Consequently, new algorithms for multiband linearization based on Digital Pre-Distortion (DPD) are needed which can handle severe non-linear distortions caused by not only a signal sent to a specific band, but also other signals sent to other bands due to cross-carriers inter-modulations. Radio hardware imperfections, such as non-linear responses of PAs, result in distortion of the transmitted signals. Such distortions affect not only the transmitted signals themselves, but also cause spectrum broadening, which also harms the adjacent channels. An increase in the number of concurrently linearized frequency bands leads to the research of generic and simpler linearization algorithms for compensating possibly increased hardware complexity.

In a concurrent multi-band PA, the nonlinearity of the PA makes different carriers located in different bands intermodulate each other, which makes the PA output for each band dependent not only on the input signal to that specific band but also influenced by inputs to other bands.

Moreover, if the whole range of spectrum where multiband signals are located is to be linearized, very high sampling rates and hence large computational resources are required. In addition, wideband amplifiers are likely to have very long memory considered over their total Instantaneous Bandwidth (IBW) which motivates keeping the linearization efforts around bands of interest that require fewer memory terms.

Multivariate Volterra (including pruned versions such as Memory Polynomial (MP) and Generalized Memory Polynomial (GMP)) types of DPD linearizers are feasible for single or dual band transmitters. The exponential growth in complexity prohibits the use of such models for three or more bands.

Moreover, from an implementation point of view, if a DPD actuator is to be implemented using a Look Up Table (LUT) in a digital ASIC, DSP, or FPGA, then the dimension of such LUT is equivalent to the number of bands when using multivariate Volterra based DPD with intensive memory requirements.

As such, improved systems and methods for linearizing a concurrent multi-band PA are needed.

SUMMARY

Systems and methods for multiband linearization using kernel regression are provided. In some embodiments, a method of linearizing a multiband transmitter includes, for each band of a plurality of bands of the multiband transmitter: transforming a group of input signals from one or more bands of the plurality of bands into a constructed input vector space to provide transformed input signals; predistorting the transformed input signals to provide a respective group of predistorted input signals based on a determined plurality of kernel centroid locations, a determined plurality of kernel centroid widths, and a determined plurality of kernel centroid weights in accordance with a Radial Basis Function (RBF) kernel regression; and transmitting the respective group of predistorted input signals. In this way, some advantages of the embodiments disclosed herein might include some of the following. Kernel regression based multiband Digital Predistortion (DPD) is a semi blind approach as one need not to account for the non-linearity order as in Volterra-based DPD for example, only the memory depth is needed to be incorporated to the input vector space. The Computational complexity of DPD is reduced compared to Volterra-based DPD since RBFs (e.g., Gaussian, multiquadric, inverse quadratic, inverse multiquadric, triangular, etc.) are used which implies using basis functions without a need for working with very high order polynomials which tend to be numerically unstable. This can be checked out by performing Taylor expansion of Gaussian (or other) kernels. Therefore, fewer building blocks are needed to accurately approximate the NL function. Implementation complexity of multiband DPD is relaxed by means of the feasibility of one dimensional (1D) Lookup Table (LUT) implementation regardless of the number of bands.

In some embodiments, the method also includes, for each band of the plurality of bands of the multiband transmitter, prior to transforming the group of input signals: constructing the input vector space using signals from one or more bands of the plurality of bands; determining a plurality of kernel centroid locations, $\mu_c$, c: 1, . . . , C, for the RBF kernel regression in the constructed input vector space; determining a plurality of kernel centroid widths, $\gamma_c$, c: 1, . . . , C, for the RBF kernel regression in the constructed input vector space; and determining a plurality of kernel centroid weights, $w_c$, c: 1, . . . , C, for the RBF kernel regression in the constructed input vector space.

In some embodiments, constructing the input vector space comprises: constructing the input vector space using signals from the one or more bands of the plurality of bands, from signals that contribute to generating non-linear distortion with the linearization bandwidth around that band.

In some embodiments, constructing the input vector space comprises: constructing the input vector space using signals from the one or more bands of the plurality of bands where memory effects are handled by including tapped delayed signals in the input vector space.

In some embodiments, determining the plurality of kernel centroid locations comprises identifying the plurality of kernel centroid locations using K-means clustering.

In some embodiments, determining the plurality of kernel centroid locations comprises: determining the plurality of kernel centroid locations offline and then selecting the best centroids in terms of one or more of the group consisting of: Adjacent Channel Leakage Ratio (ACLR), Normalized Mean Square Error (NMSE), Operating Band Unwanted Emission (OBUE), distance to spectral mask, and IM.

In some embodiments, determining the plurality of kernel centroid widths, $\gamma_c$, c: 1, . . . , C, comprises determining the plurality of kernel centroid widths, $\gamma_c$, c: 1, . . . , C, for the RBF kernel regression to each be equal to one.

In some embodiments, the RBF kernel regression comprises Gaussian RBFs. In some embodiments, the RBF kernel regression comprises one of the group consisting of: inverse quadratic RBFs, and triangular RBFs.

In some embodiments, predistorting the transformed input signals to provide a respective group of predistorted input signals in accordance with the RBF kernel regression comprises: predistorting the transformed input signals to provide a respective group of predistorted input signals in accordance with the RBF kernel regression using a one dimensional (1D) Lookup Table (LUT).

In some embodiments, a multiband transmitter includes: a one or more antenna branches comprising a respective one or more power amplifiers coupled to a respective one or more antenna elements; and one or more DPD systems. The one or more DPD systems are operable to, for each band of a plurality of bands of the multiband transmitter: transform a group of input signals from one or more bands of the plurality of bands into a constructed input vector space to provide transformed input signals; and predistort the transformed input signals to provide a respective group of predistorted input signals based on a determined plurality of kernel centroid locations, a determined plurality of kernel centroid widths, and a determined plurality of kernel centroid weights in accordance with a RBF kernel regression; and the respective plurality of antenna elements being operable to transmit the respective group of predistorted input signals.

In some embodiments, a wireless node includes a multiband transmitter as described above. In some embodiments, the wireless node is a base station. In some embodiments, the wireless node is a wireless device.

BRIEF DESCRIPTION OF THE DRAWINGS

The accompanying drawing figures incorporated in and forming a part of this specification illustrate several aspects of the disclosure, and together with the description serve to explain the principles of the disclosure.

DETAILED DESCRIPTION

Figure 1:
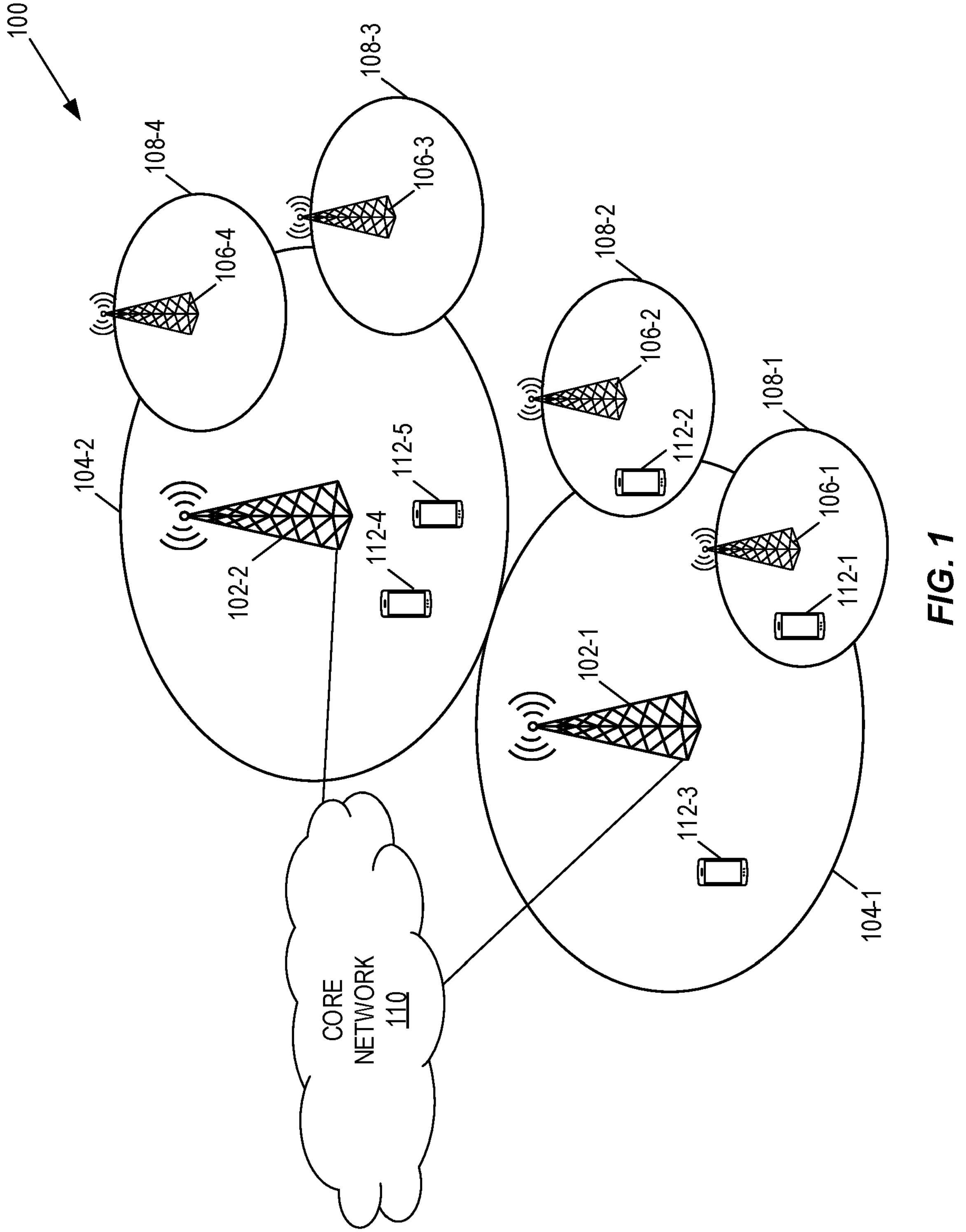
FIG. 1 illustrates one example of a cellular communications system according to some embodiments of the present disclosure.

The embodiments set forth below represent information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure.

Radio Node: As used herein, a "radio node" is either a radio access node or a wireless communication device.

Radio Access Node: As used herein, a "radio access node" or "radio network node" or "radio access network node" is any node in a Radio Access Network (RAN) of a cellular communications network that operates to wirelessly transmit and/or receive signals. Some examples of a radio access node include, but are not limited to, a base station (e.g., a New Radio (NR) base station (gNB) in a Third Generation Partnership Project (3GPP) Fifth Generation (5G) NR network or an enhanced or evolved Node B (eNB) in a 3GPP Long Term Evolution (LTE) network), a high-power or macro base station, a low-power base station (e.g., a micro base station, a pico base station, a home eNB, or the like), a relay node, a network node that implements part of the functionality of a base station or a network node that implements a gNB Distributed Unit (gNB-DU)) or a network node that implements part of the functionality of some other type of radio access node.

Core Network Node: As used herein, a "core network node" is any type of node in a core network or any node that implements a core network function. Some examples of a core network node include, e.g., a Mobility Management Entity (MME), a Packet Data Network Gateway (P-GW), a Service Capability Exposure Function (SCEF), a Home Subscriber Server (HSS), or the like. Some other examples of a core network node include a node implementing a Access and Mobility Function (AMF), a User Plane Function (UPF), a Session Management Function (SMF), an Authentication Server Function (AUSF), a Network Slice Selection Function (NSSF), a Network Exposure Function (NEF), a Network Function (NF) Repository Function (NRF), a Policy Control Function (PCF), a Unified Data Management (UDM), or the like.

Communication Device: As used herein, a "communication device" is any type of device that has access to an access network. Some examples of a communication device include, but are not limited to: mobile phone, smart phone, sensor device, meter, vehicle, household appliance, medical appliance, media player, camera, or any type of consumer electronic, for instance, but not limited to, a television, radio, lighting arrangement, tablet computer, laptop, or Personal Computer (PC). The communication device may be a portable, hand-held, computer-comprised, or vehicle-mounted mobile device, enabled to communicate voice and/or data via a wireless or wireline connection.

Wireless Communication Device: One type of communication device is a wireless communication device, which may be any type of wireless device that has access to (i.e., is served by) a wireless network (e.g., a cellular network). Some examples of a wireless communication device include, but are not limited to: a User Equipment device (UE) in a 3GPP network, a Machine Type Communication (MTC) device, and an Internet of Things (IoT) device. Such wireless communication devices may be, or may be integrated into, a mobile phone, smart phone, sensor device, meter, vehicle, household appliance, medical appliance, media player, camera, or any type of consumer electronic, for instance, but not limited to, a television, radio, lighting arrangement, tablet computer, laptop, or PC. The wireless communication device may be a portable, hand-held, computer-comprised, or vehicle-mounted mobile device, enabled to communicate voice and/or data via a wireless connection.

Network Node: As used herein, a "network node" is any node that is either part of the RAN or the core network of a cellular communications network/system.

Transmission/Reception Point (TRP): In some embodiments, a TRP may be either a network node, a radio head, a spatial relation, or a Transmission Configuration Indicator (TCI) state. A TRP may be represented by a spatial relation or a TCI state in some embodiments. In some embodiments, a TRP may be using multiple TCI states.

Note that the description given herein focuses on a 3GPP cellular communications system and, as such, 3GPP terminology or terminology similar to 3GPP terminology is oftentimes used. However, the concepts disclosed herein are not limited to a 3GPP system.

Note that, in the description herein, reference may be made to the term "cell"; however, particularly with respect to 5G NR concepts, beams may be used instead of cells and, as such, it is important to note that the concepts described herein are equally applicable to both cells and beams.

FIG. 1 illustrates one example of a cellular communications system 100 in which embodiments of the present disclosure may be implemented. In the embodiments described herein, the cellular communications system 100 is a 5G system (5GS) including a Next Generation RAN (NG-RAN) and a 5G Core (5GC) or an Evolved Packet System (EPS) including an Evolved Universal Terrestrial RAN (E-UTRAN) and a Evolved Packet Core (EPC). In this example, the RAN includes base stations 102-1 and 102-2, which in the 5GS include NR base stations (gNBs) and optionally next generation eNBs (ng-eNBs) (e.g., LTE RAN nodes connected to the 5GC) and in the EPS include eNBs, controlling corresponding (macro) cells 104-1 and 104-2. The base stations 102-1 and 102-2 are generally referred to herein collectively as base stations 102 and individually as base station 102. Likewise, the (macro) cells 104-1 and 104-2 are generally referred to herein collectively as (macro) cells 104 and individually as (macro) cell 104. The RAN may also include a number of low power nodes 106-1 through 106-4 controlling corresponding small cells 108-1 through 108-4. The low power nodes 106-1 through 106-4 can be small base stations (such as pico or femto base stations) or Remote Radio Heads (RRHs), or the like. Notably, while not illustrated, one or more of the small cells 108-1 through 108-4 may alternatively be provided by the base stations 102. The low power nodes 106-1 through 106-4 are generally referred to herein collectively as low power nodes 106 and individually as low power node 106. Likewise, the small cells 108-1 through 108-4 are generally referred to herein collectively as small cells 108 and individually as small cell 108. The cellular communications system 100 also includes a core network 110, which in the 5G System (5GS) is referred to as the 5GC. The base stations 102 (and optionally the low power nodes 106) are connected to the core network 110.

The base stations 102 and the low power nodes 106 provide service to wireless communication devices 112-1 through 112-5 in the corresponding cells 104 and 108. The wireless communication devices 112-1 through 112-5 are generally referred to herein collectively as wireless communication devices 112 and individually as wireless communication device 112. In the following description, the wireless communication devices 112 are oftentimes UEs, but the present disclosure is not limited thereto.

In a concurrent multi-band Power Amplifier (PA), the nonlinearity of the PA makes different carriers located in different bands cross-modulate each other, which makes the PA output for each band dependent not only on the input signal to that specific band but also influenced by inputs to other bands.

Figure 2:
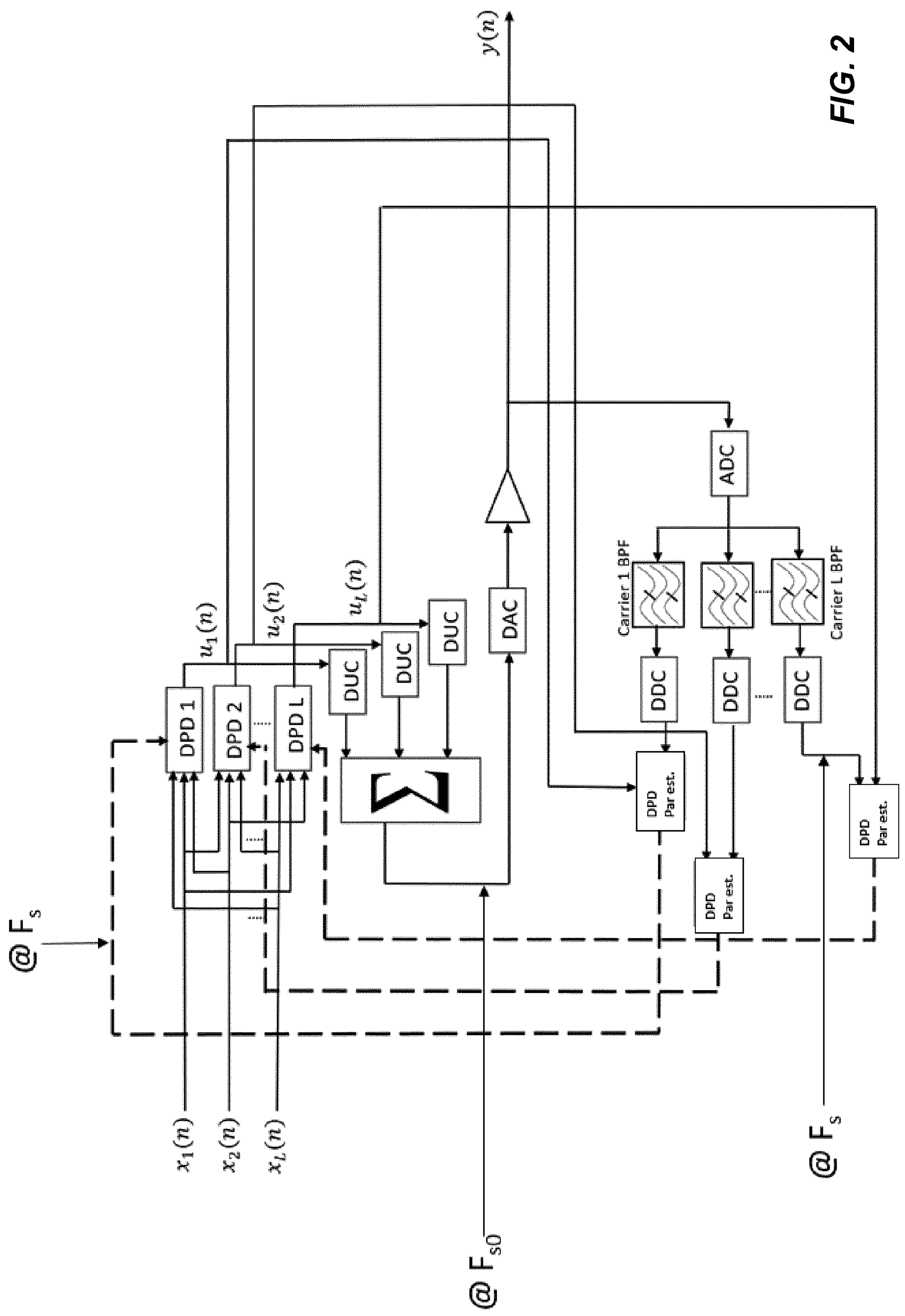
FIG. 2 illustrates a general multiband Digital Predistortion (DPD) system architecture according to some embodiments of the present disclosure.

Moreover, if the whole range of spectrum where multi-band signals are located is to be linearized, very high sampling rates and hence large computational resources are required. In addition, wideband amplifiers are likely to have very long memory considered over their total Instantaneous Bandwidth (IBW) which motivates keeping the linearization efforts around bands of interest that require fewer memory terms. Therefore, computing the predistortion terms at baseband rates reduces resource requirements resulting in targeted areas of spectrum around used carriers being linearized and the inter-band distortions being handled by filters. The system architecture for multi-band Digital Predistortion (DPD) is shown in FIG. 2. FIG. 2 illustrates a general multiband DPD system architecture. Spectrum around each individual band is linearized. The originally sampled data is up sampled by the Digital to Analog Converter. At the Transmission Operation Receiver (TOR) bath, the data is digitally-down converted. As shown in FIG. 2, each input signal is processed by a corresponding DPD. The output of these DPD will be combined by an adder and provided to a Digital-to-Analog Converter (DAC) and amplified. The output signal is sampled and provided to a system to update the DPD parameters. As shown in FIG. 2, the sampled output signal is separated into the various carriers by Band Pass Filters (BPF) and digitally down converted before being processed by separate DPD parameter estimators. These new DPD parameters are fed back to the corresponding DPD. Some embodiments of this disclosure use Radial Basis Function (RBF) kernel regression to perform digital predistorters that linearize all bands.

Multivariate Volterra (including pruned versions such as Memory Polynomial (MP) and Generalized Memory Polynomial (GMP)) types of DPD linearizers are feasible for single or dual band transmitters. The complexity of such models in terms of numbers of model coefficients, however, grow exponentially with triple band and beyond, which makes such types of methods not particularly suited for multi (>2)-band PAs. Therefore, it is strongly desired to investigate other techniques for DPD in multi-band power amplifiers. When the PA response is richly multivariate nonlinear, then a Kernel Regression method can be useful. A Kernel Regression method provides relatively few building blocks with the ability to deal with rich nonlinearity with no prior assumptions on the nonlinear functions.

Moreover, from an implementation point of view, if a DPD actuator is to be implemented using a Look Up Table (LUT) in a digital ASIC, DSP, or FPGA, then the dimension of such LUT is equivalent to the number of bands when using multivariate Volterra based DPD with intensive memory requirements.

As such, improved systems and methods for linearizing a concurrent multi-band PA are needed.

Some embodiments herein include a concurrent multi-band DPD solution based on RBF kernel regression. Some embodiments address the complexity issued of state-of-the-art solutions, mainly, Volterra based linearizers. Moreover, some embodiments address implementation challenges in DSP, FPGA and ASIC when it comes to multi-dimensional LUT for multi-band DPD, as some embodiments herein provide the feasibility of implementing the DPD in a one-dimensional LUT regardless of the number of bands by means of performing the DPD as a function of input vector space attributes and not direct signal attributes.

Figure 3A:
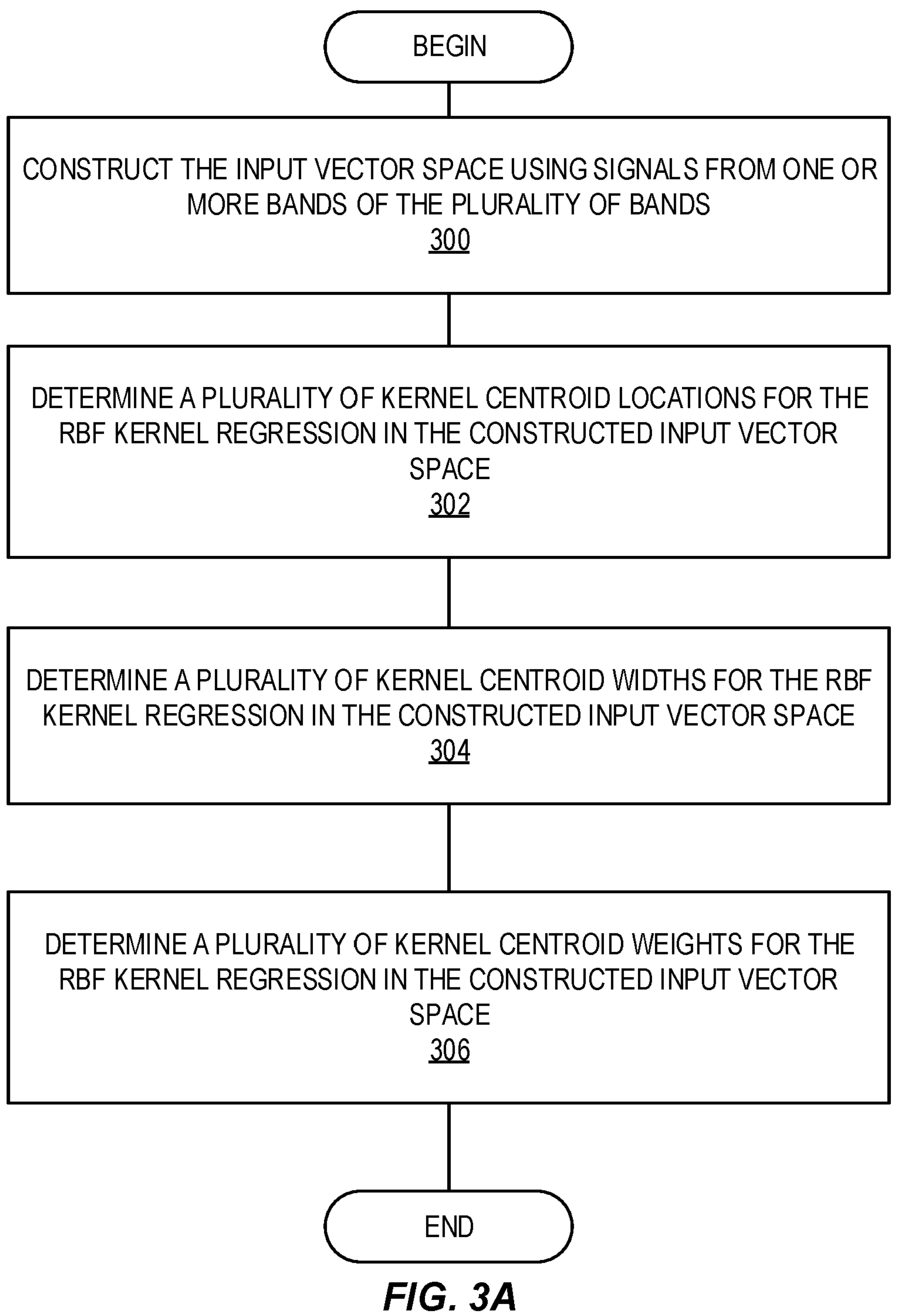
FIGS. 3A and 3B illustrate methods of linearizing a multiband transmitter according to some embodiments of the present disclosure.
Figure 3B:
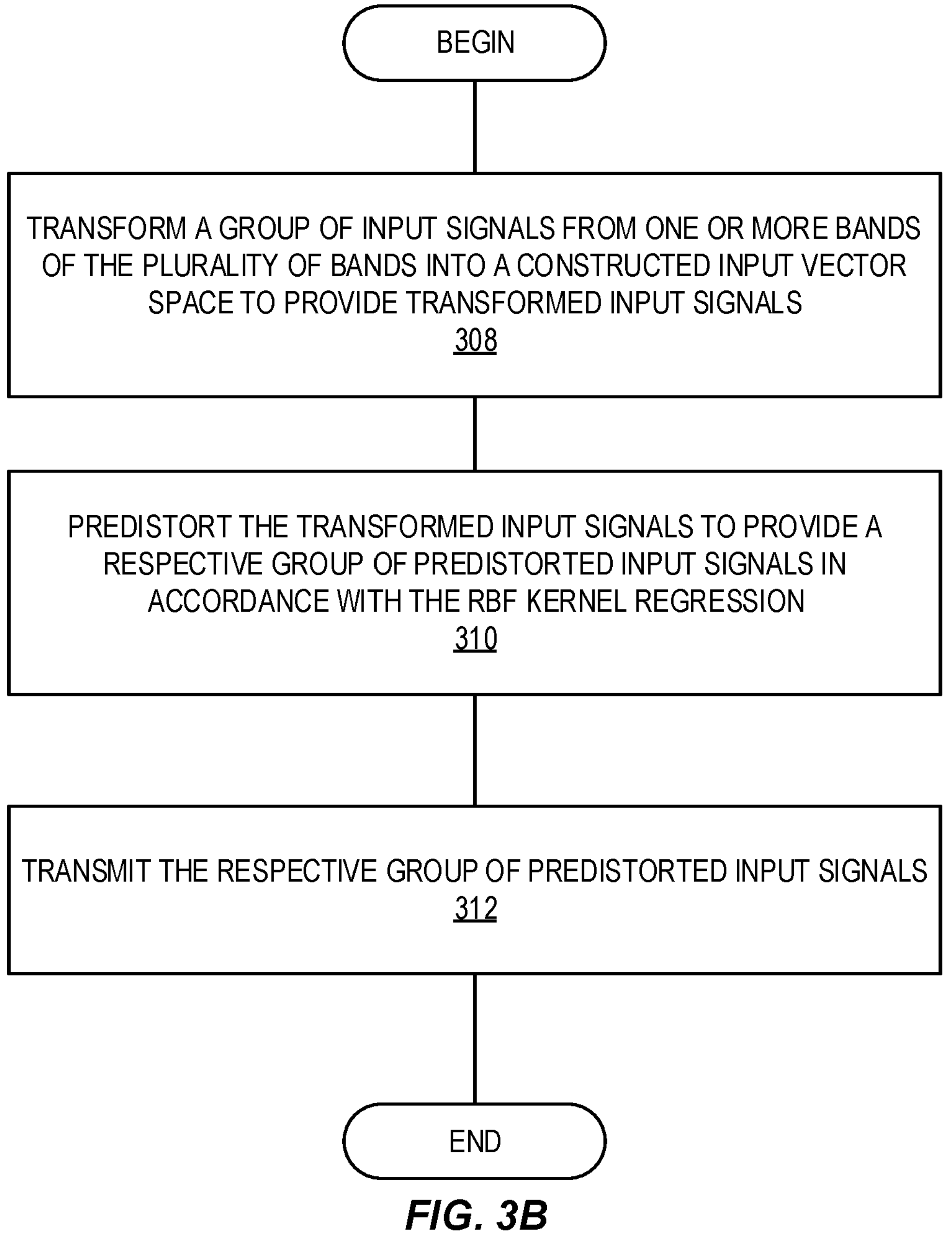

Systems and methods for multiband linearization using kernel regression are provided. FIGS. 3A and 3B illustrate methods of linearizing a multiband transmitter according to some embodiments of the present disclosure.

In some embodiments, prior to transforming the group of input signals, the method includes generating the RBF kernel regression parameters. FIG. 3A illustrates this generation of the parameters. This can include: constructing the input vector space using signals from one or more bands of the plurality of bands (step 300); determining a plurality of kernel centroid locations, $\mu_c$, c: 1, . . . , C, for the RBF kernel regression in the constructed input vector space; determining (step 302) a plurality of kernel centroid widths, $\gamma_c$, c: 1, . . . , C, for the RBF kernel regression in the constructed input vector space (step 304); and determining a plurality of kernel centroid weights, $w_c$, c: 1, . . . , C, for the RBF kernel regression in the constructed input vector space (step 306).

In some embodiments, once the RBF kernel regression parameters have been generated, these can be used for linearization. FIG. 3B illustrates this use of the parameters. In some embodiments, the steps of FIGS. 3A and 3B are performed by the same node or at the same time. In some embodiments, the steps of FIGS. 3A and 3B are performed by different nodes and/or at different times. In some embodiments, a method of linearizing a multiband transmitter includes, for each band of a plurality of bands of the multiband transmitter: transforming a group of input signals from one or more bands of the plurality of bands into a constructed input vector space to provide transformed input signals (step 308); predistorting the transformed input signals to provide a respective group of predistorted input signals based on a determined plurality of kernel centroid locations, a determined plurality of kernel centroid widths, and a determined plurality of kernel centroid weights in accordance with the RBF kernel regression (step 310); and transmitting the respective group of predistorted input signals (step 312). In this way, some advantages of the embodiments disclosed herein might include some of the following. Kernel regression based multiband DPD is a semi blind approach as one need not account for the non-linearity order, as in Volterra-based DPD, for example. Only the memory depth is needed to be incorporated to the input vector space. The computational complexity of DPD is reduced compared to Volterra-based DPD since RBFs (e.g., Gaussian, multi-quadric, inverse quadratic, inverse multiquadric, triangular, etc.) are used, which implies using basis functions with richer nonlinearities. This can be checked out by performing Taylor expansion of Gaussian (or other) kernels. Therefore, fewer building blocks are needed to accurately approximate the NL function. Implementation complexity of multiband DPD is relaxed by means of the feasibility of one dimensional (1D) LUT implementation regardless of the number of bands.

In some embodiments, RBF kernels are used to estimate a Non-Linear (NL) function that linearizes a concurrent multi-band PA. In some embodiments, the linearization is performed on selected portions of spectrum around each band and the rest of the frequency spectrum is left for analog filtering. The NL-function is estimated on a constructed input vector space. Intermodulation products (IM) among different bands are handled by composing an input vector space of signals sent to bands that are involved in those IMs. Moreover, to introduce the memory effects, in some embodiments, tapped delayed inputs are incorporated to the input vector space. RBF Kernels are placed at representative centroids of the input vector space where an NL function that relates a pre-distorted signal and its corresponding input vector is estimated as a weighted sum of quantities that are dependent on input vector attributes and RBF functions (i.e., vector norms and/or Euclidian distances).

In addition to complexity reduction, estimating a function on its input vector space serves as a method to ease the implementation of linearizers using Look Up Tables (LUT) in a DSP, FPGA or digital ASIC. Essentially, this is because 1D LUT is feasible with such an approach regardless of the number of bands being concurrently utilized. However, in some embodiments, that 1D LUT implementation is preceded by some arithmetic operations such as vector norm calculation. In some embodiments, various calculations are implementable using 1-D LUT where both input signal vectors and RBF centroid vectors are collapsed into scalars by calculating the Euclidean norms (or other norms) of their differences.

Some advantages of the embodiments disclosed herein might include some of the following. Kernel regression based multiband DPD is a semi blind approach as one need not account for the non-linearity order as in Volterra-based DPD for example. Only the memory depth is needed to be incorporated to the input vector space. The computational complexity of DPD is reduced compared to Volterra-based DPD since RBFs (e.g., Gaussian, multiquadric, inverse quadratic, inverse multiquadric, triangular, etc.) are used which implies using basis functions with richer nonlinearities. This can be checked out by performing Taylor expansion of Gaussian (or other) kernels. Therefore, fewer building blocks are needed to accurately approximate the NL function. Implementation complexity of multiband DPD is relaxed by means of the feasibility of 1D LUT implementation regardless of the number of bands. Since no prior assumptions on the PA non-linearity are made, the RBF kernel regression approach can handle impairments introduced by i.e., aliasing due to under-sampling.

Kernel methods can operate in a high-dimensional feature space without computing the coordinate of the data in that space, but rather by simply computing the inner products between the images of all pairs of data in the feature space. This operation is often computationally cheaper than the explicit computation of the coordinates. Therefore, with the so called "kernel trick" (See, e.g., C. M. Bishop, "Pattern Recognition and Machine Learning", Springer, 2006, page 292, referred to herein as [1]), (See, e.g., Y. S. Abu-Mostafa, M. Magdon-Ismail, H.-T. Lin, "Learning from Data", AML Book. 2012, referred to herein as [2]) the explicit mapping that is needed to get linear learning algorithms to learn a nonlinear function or decision boundary, can be avoided. For example, for all data vectors x,x' in the input space, a certain kernel functions $\varphi(x,x')$, can be expressed as an inner product in another space Z, i.e., $\varphi(x,x')=z^Tz$. Thus, if Kernel $\varphi(x,x')$ is an inner product in some space Z, then a (non-linear) function can be estimated without performing the transform into Z-domain. In fact, Z-domain needs not to exist if $z^Tz$ exists. For further elaboration on this manner, the reader is referred to [2].

RBF kernel (or a Gaussian Kernel) on two samples x,x', represented as feature vectors in some input space, is defined as:

$$\varphi(x, x') = \exp\left(-\gamma \| x - x' \|^2\right) \tag{1}$$

The RBF kernel represents a measure of similarity between vectors expressed as a decaying function of the distance between the vectors in their vector space. If the two vectors are close together then, squared Euclidean distance $\|x-x'\|^2$ will be small. For $\gamma>0$, it follows that $\gamma\|x-x'\|^2$ will be larger and thus closer vectors have a larger RBF kernel value. This function is of the form of a bell-shaped curve. The $\gamma$ parameter sets the width of the bell-shaped curve.

The standard form of Kernel regression is given as follows (See, e.g., E. Zenteno, Z. A. Khan, M. Isaksson and P. Händel, "Finding Structural Information About RF Power Amplifiers Using an Orthogonal Nonparametric Kernel Smoothing Estimator," in IEEE Transactions on Vehicular Technology, vol. 65, no. 5, pp. 2883-2889, May 2016, referred to herein as [8]):

$$h(x) = \sum_{n=1}^{N} w_n \varphi(x, x_n) \tag{2}$$

The learning task is to find converged "weights" or estimates:

$$w = [w_1, \ldots , w_N]. \tag{3}$$

Note that a training set is given and an estimate of function h(x) is required. As RBF Kernels are centered around representative centroids of the input space, then, in some embodiments, instead of N basis functions (i.e., N datapoints $[x_1, \ldots, x_N]$), choose C<<N representative centers $\mu_c$, c: 1, . . . , C and then the Kernel Regression form is given as:

$$h(x) = \sum_{c=1}^{C} w_c \exp\left(-\gamma_c \|x - \mu_c\|^2\right). \tag{4}$$

The N datapoints $[x_1, \ldots, x_N]$ can be used as the centers (as is common in interpolation). By choosing fewer centers, the computational complexity can be reduced. Additionally, since these centers are not limited to the datapoints, the resulting estimation can be more generalizable, even if the estimation does not accurately reproduce the exact results of the training set.

For finding the weights w, there are N equations in C<N unknowns. The Kernel Regression is given as:

$$\sum_{c=1}^{C} w_c \exp\left(-\gamma_c \|x - \mu_c\|^2\right) = y \tag{5}$$

or in matrix form as:

$$\begin{bmatrix} \exp(-\gamma_1 \|x_1 - \mu_1\|^2) & \cdots & \exp(-\gamma_C \|x_1 - \mu_C\|^2) \\ \exp(-\gamma_1 \|x_2 - \mu_1\|^2) & \cdots & \exp(-\gamma_C \|x_2 - \mu_C\|^2) \\ \vdots & \ddots & \vdots \\ \exp(-\gamma_1 \|x_N - \mu_1\|^2) & \cdots & \exp(-\gamma_C \|x_N - \mu_C\|^2) \end{bmatrix} \begin{bmatrix} w_1 \\ w_2 \\ \vdots \\ w_C \end{bmatrix} = \begin{bmatrix} y_1 \\ y_2 \\ \vdots \\ y_N \end{bmatrix}, \tag{6}$$

or simply as:

$$\Phi w = y \tag{7}$$

If $\Phi^T\Phi$ is invertible, then the weights are found as:

$$w = \left(\Phi^T \Phi\right)^{-1} \Phi^T y \tag{8}$$

It is noted that:

$\mu_c$, c: 1, . . . , C are kernels centroids locations and can be found by using Lloyd algorithm (See, e.g., S. Lloyd, "Least squares quantization in PCM," in IEEE Transactions on Information Theory, vol. 28, no. 2, pp. 129-137, March 1982, referred to herein as [3]);

$\gamma_c$, c: 1, . . . , C are the kernels widths or decaying parameters which can be optimized by using standard gradient decent algorithm (see [1]);

An iterative approach for optimizing both w and $\gamma_c$, c: 1, . . . , C is feasible (i.e., expectation maximization method) (See, e.g., M. Hamid and B. Beferull-Lozano, "Nonparametric spectrum cartography using adaptive radial basis functions," in IEEE International Conference on Acoustics, Speech and Signal Processing (ICASSP), New Orleans, LA, 2017, referred to herein as [4]).

As PAs are amplitude driven devices, then for saving computation resources, the phase can be eliminated. The signal amplitude support can be taken as the input space and can decompose input variable $\gamma$ to its amplitude and phase components and estimate the amplitude and phase response individually. The phase response regression is decomposed the same way. Such a method has two regression processes: one for the amplitude response and another for the phase response. For the sake of simplicity, hereafter a single regression process is considered which is to be duplicated later in implementation to amplitude regression and phase response regression keeping in mind that the regression matrix remains the same in both cases.

RBFs have been used for DPD in both neural networks and support vector machines for single band PAs in (See, e.g., M. Isaksson, D. Wisell and D. Ronnow, "Wide-band dynamic modeling of power amplifiers using radial-basis function neural networks," in IEEE Transactions on Microwave Theory and Techniques, vol. 53, no. 11, pp. 3422-3428, November 2005, referred to herein as [5]) and (See, e.g., referred to herein as J. Xu, W. Jiang, L. Ma, M. Li, Z. Yu and Z. Geng, "Augmented Time-Delay Twin Support Vector Regression-Based Behavioral Modeling for Digital Predistortion of RF Power Amplifier," in IEEE Access, vol. 7, pp. 59832-59843, 2019 [6]), respectively.

Moreover, the usage of RBF for linearizing a MIMO transmitter has been introduced in (Mohamed Hamid, WO2020187384—PER-BRANCH, COMBINED, AND GROUPED COMBINED MIMO DPD, Patent application, referred to herein as [7]), which is hereby incorporated by reference. However, there was no teaching regarding employing RBFs for concurrent multiband transmitter linearization as in some embodiments of the current disclosure. In [8], a single band PA model structure was extracted using triangular smoothing kernels. However, kernel functions themselves were not used for DPD parameters estimation.

Figure 4:
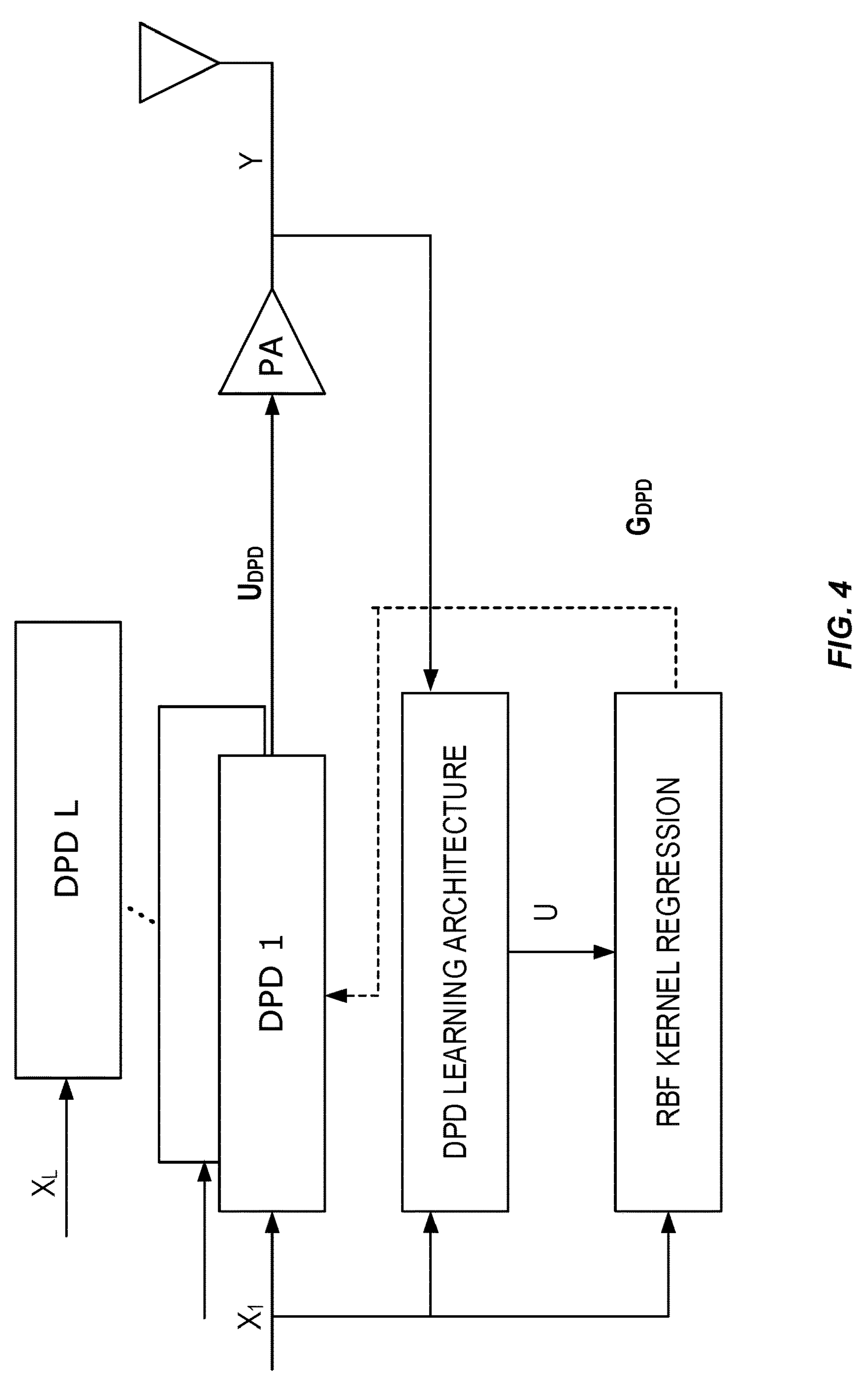
FIG. 4 illustrates a general Radial Basis Function (RBF) kernel regression based DPD according to some embodiments of the present disclosure.

The system model of a PA preceded by a DPD actuator utilizing RBF kernel regression is illustrated in FIG. 4. The model follows the conventional DPD architecture that consists of a direct signal transmission path and a part that is responsible for pre-distorter training and adaption known as Transmission Operation Receiver (TOR). In the direct signal transmission path, an input signal x is fed to a DPD actuator that would ideally pre-distort the input signal in such way that the nonlinear PA output signal y would be a linearly amplified version of its corresponding input x, i.e., $$y = const. \times x.$$

The DPD learning architecture block is used in the training process of a desired pre-distorter output signal u. The signal u is used as a reference to construct the RBF kernel regression model as close to the desired DPD signal as possible (i.e., RBF kernels are used to model u). As a result of the RBF kernel regression process, a model output in the form of pre-distorter gain $G_{DPD}$ is derived, that is used to pre-distort one of the input signal band.

Figure 5:
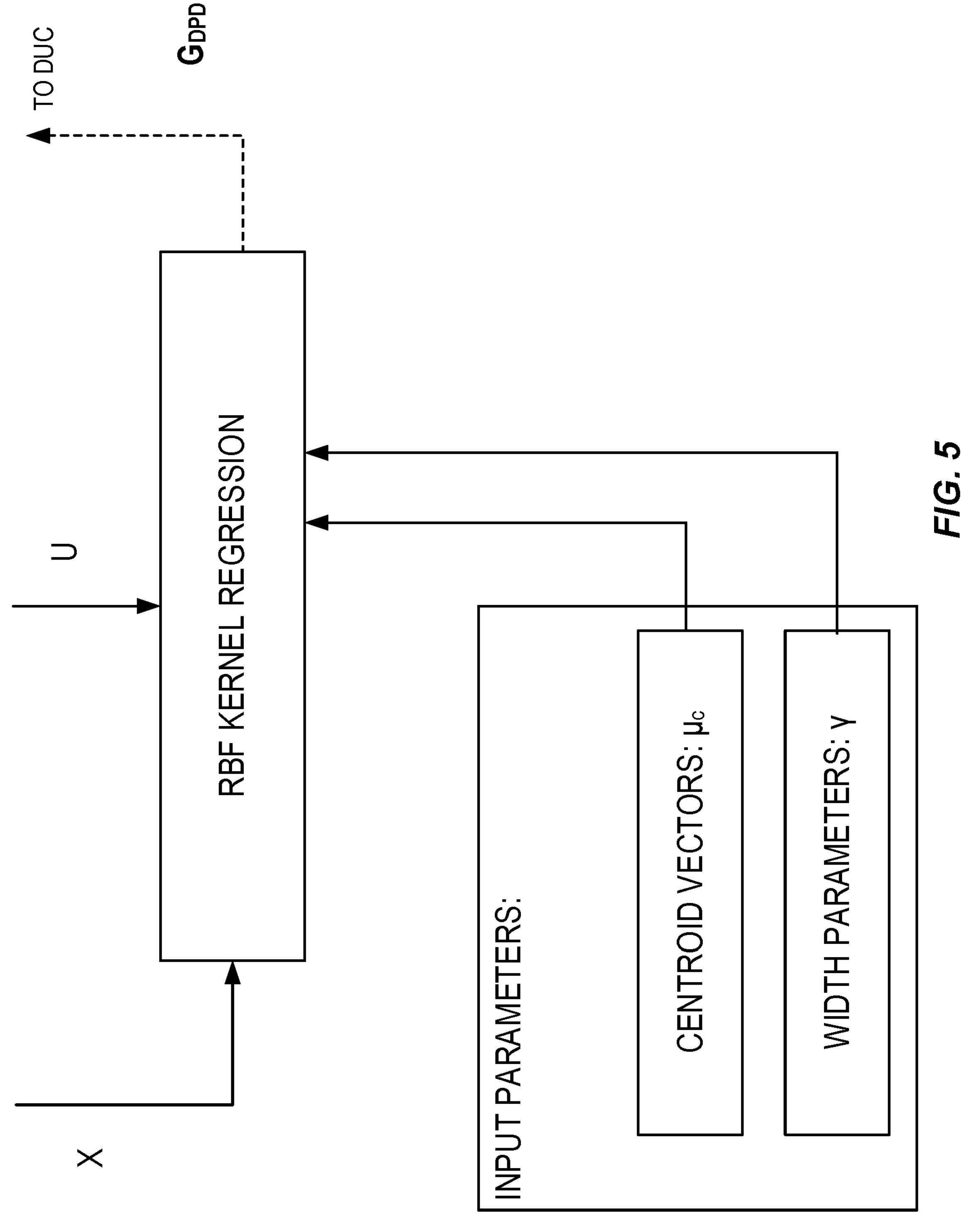
FIG. 5 illustrates a block diagram of kernel regression process for generating a desired predisposed output according to some embodiments of the present disclosure.

In order to model the RBF kernel regression-based pre-distorter, an input signal vector x, centroid vectors $\mu_c$–s and a centroid width parameter $\gamma_c$ are required as well as a desired pre-distorter output signal u as it is shown in FIG. 5. As a result, a model output in a form of a pre-distorting gain vector $G_{DPD}$ is produced.

In general, the task is to compose a regression matrix $\Phi$ that relates model input signals to model output according to Eq. (6). Here, in Eq. (9), the notation is updated according to an RBF kernel regression model practical implementation by taking into consideration the desired pre-distorted signal u. In addition, to differentiate different band actuators, a superscript l is used to identify inputs and outputs corresponding to band l. Moreover, it is important to note that a bias term (a column vector of ones) is added to the regression matrix $\Phi$. The bias term performs present sample $x_n$ amplitude and phase linear mapping from input to output. It adds additional terms and results in additional weight to both (amplitude and phase) weight vectors. Accordingly, the regression model becomes:

$$\underbrace{\begin{bmatrix} 1 & \exp\left(-\gamma_1\left\|x_1^l-\mu_1\right\|^2\right) & \cdots & \exp\left(-\gamma_C\left\|x_1^l-\mu_C\right\|^2\right) \\ 1 & \exp\left(-\gamma_1\left\|x_2^l-\mu_1\right\|^2\right) & \cdots & \exp\left(-\gamma_C\left\|x_2^l-\mu_C\right\|^2\right) \\ & \vdots & \ddots & \vdots \\ 1 & \exp\left(-\gamma_1\left\|x_N^l-\mu_1\right\|^2\right) & \cdots & \exp\left(-\gamma_C\left\|x_N^l-\mu_C\right\|^2\right) \end{bmatrix}}_{\Phi} \underbrace{\begin{bmatrix} w_0^l \\ w_2^l \\ \vdots \\ w_C^l \end{bmatrix}}_{w^l} = \underbrace{\begin{bmatrix} u_1^l \\ u_2^l \\ \vdots \\ u_N^l \end{bmatrix}}_{u^l} \tag{9}$$

where $$x_n^l$$

is the constructed signal vector of band l, and $\mu_c$, is a centroid vector with a corresponding Gaussian kernel width of $\gamma_c$.

In order to handle the distortion generated by IM products falling within the linearization bandwidth of each band, signals sent to other bands are also incorporated into input signal vectors. The generic model for the signal vector $$x_n^l$$

is as follows:

$$x_n^l = \left[\left|x^1(n)\right|, \left|x^1(n-1)\right|, \ldots, \left|x^1(n-M_1)\right|, \left|x^2(n)\right|, \left|x^2(n-1)\right|, \ldots, \left|x^2(n-M_2)\right|, \ldots, \left|x^L(n)\right|, \left|x^L(n-1)\right|, \ldots, \left|x^L(n-M_L)\right|\right]^T \tag{10}$$

where the index n denotes the reference sample index, upper index l=1, . . . , L denotes the input signal band number and $M_l$ stands for used memory depth of a certain band. In some embodiments, $M_1$-$M_L$ can be different for different bands. The signal vector length is dependent on the used number of bands and the corresponding memory depths of each band. For example, a 5-element vector that consists of current and two past time instant samples of the own band and only current samples of other two bands, would be:

$$x_n^1 = \left[\left|x^1(n)\right|, \left|x^1(n-1)\right|, \left|x^1(n-2)\right|, \left|x^2(n)\right|, \left|x^3(n)\right|\right]^T, \tag{11a}$$

$$x_n^2 = \left[\left|x^1(n)\right|, \left|x^2(n)\right|, \left|x^2(n-1)\right|, \left|x^2(n-2)\right|, \left|x^3(n)\right|\right]^T, \tag{11b}$$

$$x_n^3 = \left[\left|x^1(n)\right|, \left|x^2(n)\right|, \left|x^3(n)\right|\left|x^3(n-1)\right|, \left|x^3(n-2)\right|\right]^T. \tag{11c}$$

In some embodiments, the weights for the pre-distorter kernel model in Eq. (9) can be found using Least Squares (LS) solution as:

$$w^l = \left(\Phi^T\Phi\right)^{-1}\Phi^T u^l. \tag{12}$$

As explained earlier, in some embodiments, each band's amplitude and phase weights, $$w^l_{amp} \text{ and } w^l_{phase},$$

are separately derived during the weights estimation process, resulting in two regression processes:

$$w^l_{amp} = \left(\Phi^T\Phi\right)^{-1}\Phi^T u^l_{amp} \tag{13}$$
$$w^l_{phase} = \left(\Phi^T\Phi\right)^{-1}\Phi^T u^l_{phase}$$

The two processes in (13) share the same matrix inversion and one matrix multiplication. Therefore, in some embodiments, computations are spared if those two operations are performed once and only the last operation of matrix-vector multiplication is carried out twice.

Finally, a pre-distortion vector $$G^l_{DPD}$$

that pre-distorts band l input signal vector $x^l$ amplitude and phase according to the derived RBF kernel regression model:

$$G^l_{DPD} = \Phi w^l_{amp} \odot e^{i\Phi w^l_{phase}}, \tag{14}$$

where Hadamard product $\odot$ stands for elementwise multiplication of vectors. Now the current band pre-distorted signal $$u^l_{DPD}$$

is found as:

$$u^l_{DPD} = G^l_{DPD} \odot x^l \tag{15}$$

From DPD actuator implementation perspective, one of the main advantages this method offers is that all the dimensionality due to multiple bands is collapsed into one. This can be seen from the functional diagram shown by FIG. 6, where the multidimensional vectors of data samples $x_n$ and centroids $\mu_c$, can be handled separately and collapsed into a vector Euclidian norm which is a scalar. The most computationally extensive part of exponential function can be replaced by a 1D-LUT as shown in FIG. 7.

To validate the functionality and performance of RBF kernel regression for multi-band linearization, simulations were carried out with parameters included in Table 1.

TABLE 1

| Simulation Parameters | |
|---|---|
| Parameter | Value/type |
| Own band memory depth | 1 |
| Other bands memory depths, $M_1$, $M_2$ | 0 |
| Signals | LTE 20 MHz Downlink (DL) Frequency-Division Duplexing (FDD) signals |
| Carriers frequencies | B1 @ 2140 MHz, B3 @ 1842.5 MHz, B7 @ 2655 MHz |
| Linearization BW around each carrier | 122.88 MHz |
| Passband data rate | 2.4576 Giga-Samples/Second (Gsps) |
| PA | Class AB simulated PA with a memory polynomial model having a NL order of 3 and a memory depth of 1 |
| Learning architecture | Iterative Learning Control (ILC) |
| Number of RBF kernels | 50 |

Figure 6:
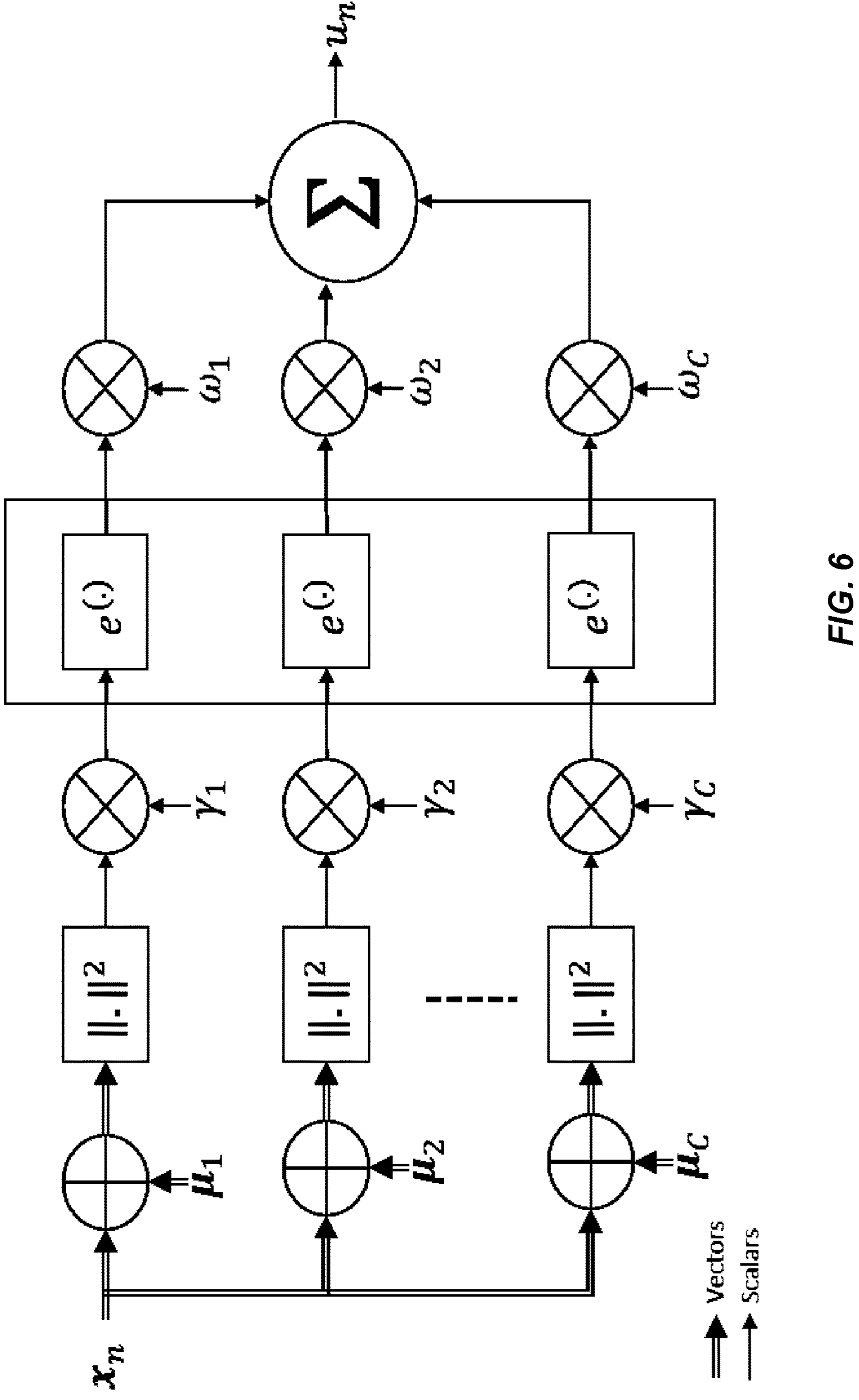
FIG. 6 illustrates an actuator function (e.g., Equation 9) shown with functional blocks according to some embodiments of the present disclosure.
Figure 7:
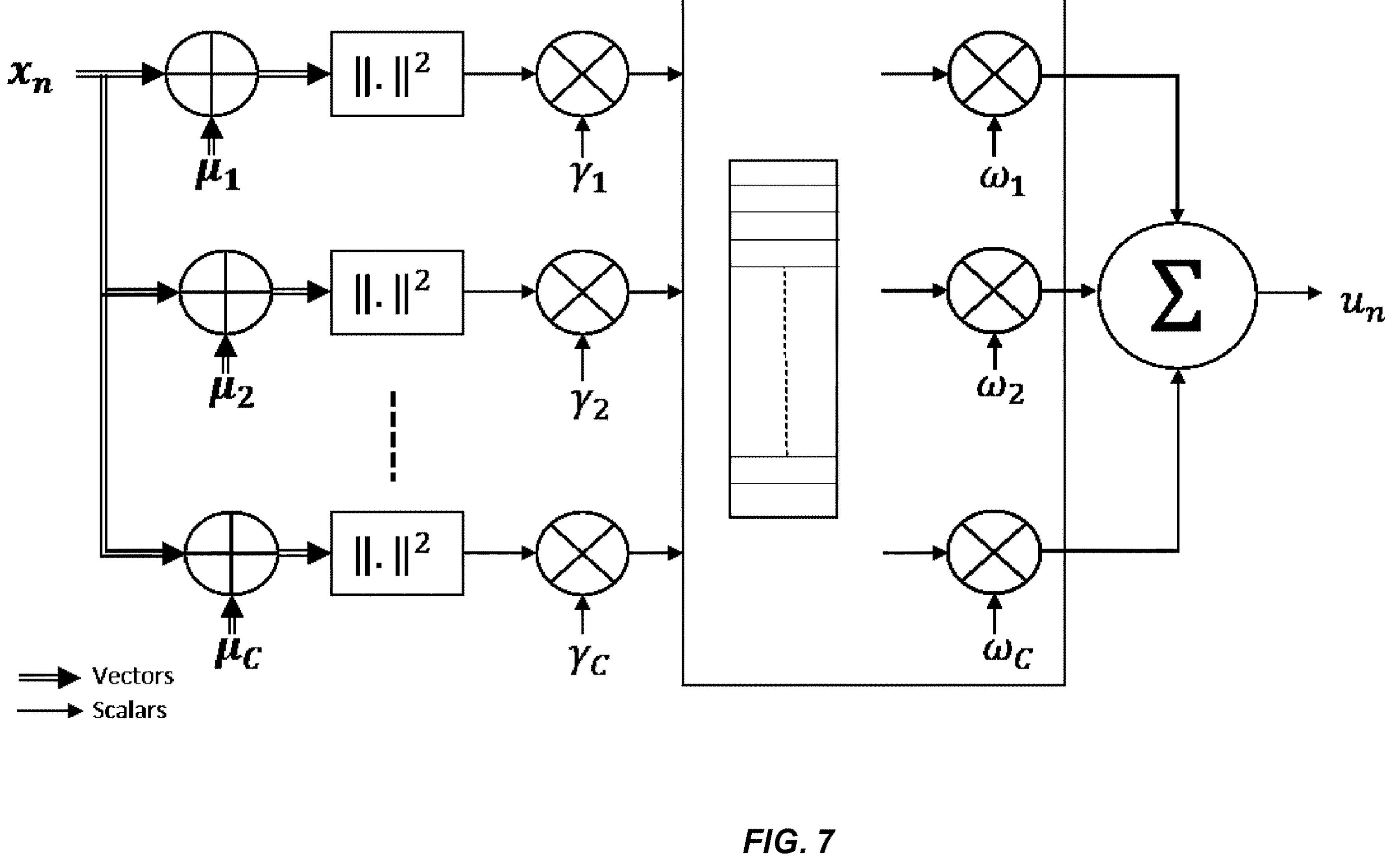
FIG. 7 illustrates an actuator function with the computation intensive exponential function replaced by one dimensional Lookup Table (LUT) according to some embodiments of the present disclosure.

Output spectrums of the entire operation frequency of the PA and around each carrier separately are shown in FIG. 6 and FIG. 7 respectively.

Figure 8:
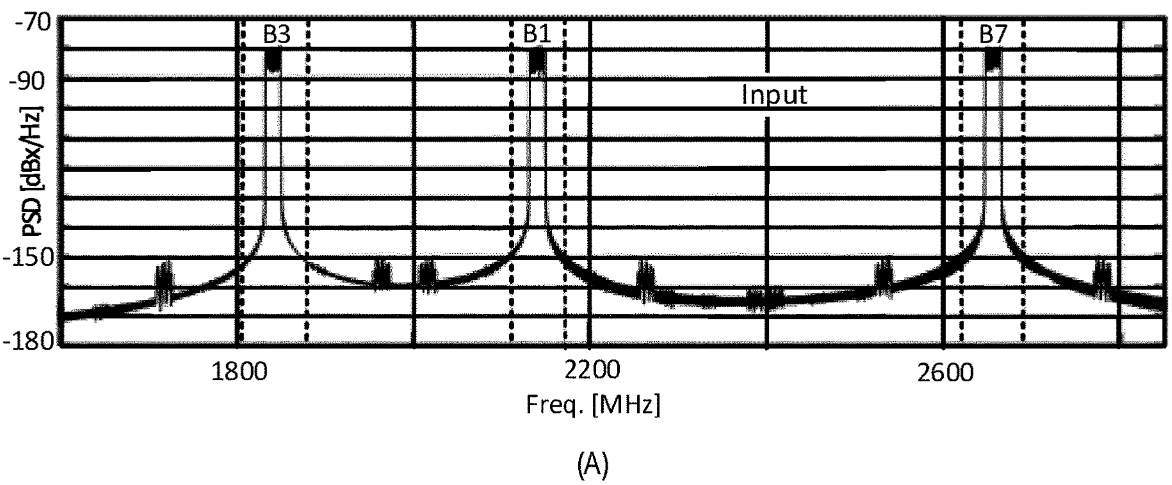
FIG. 8 illustrates an input and output spectrum both before and after applying Kernel regression DPD for the entire operation frequency of the Power Amplifier (PA) according to some embodiments of the present disclosure.
Figure 8:
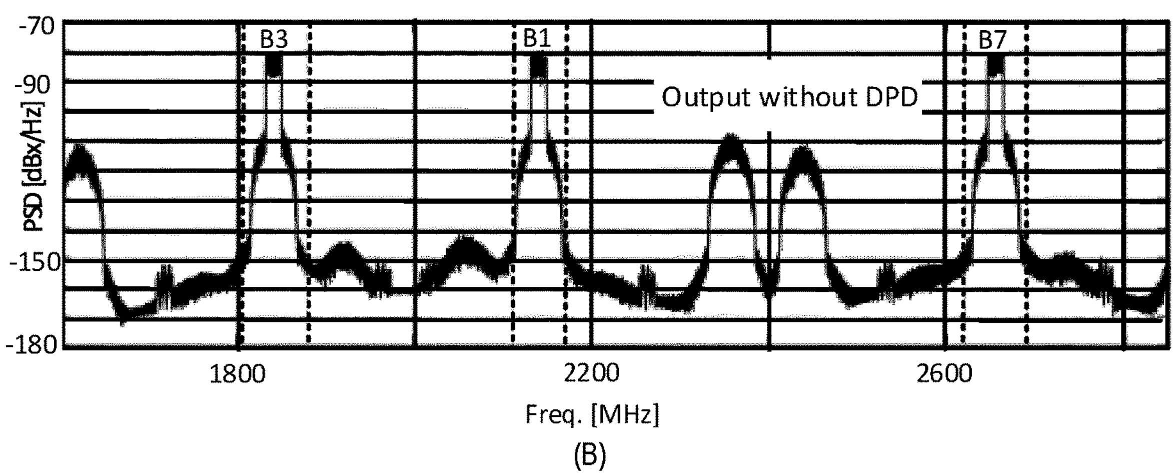
Figure 8:
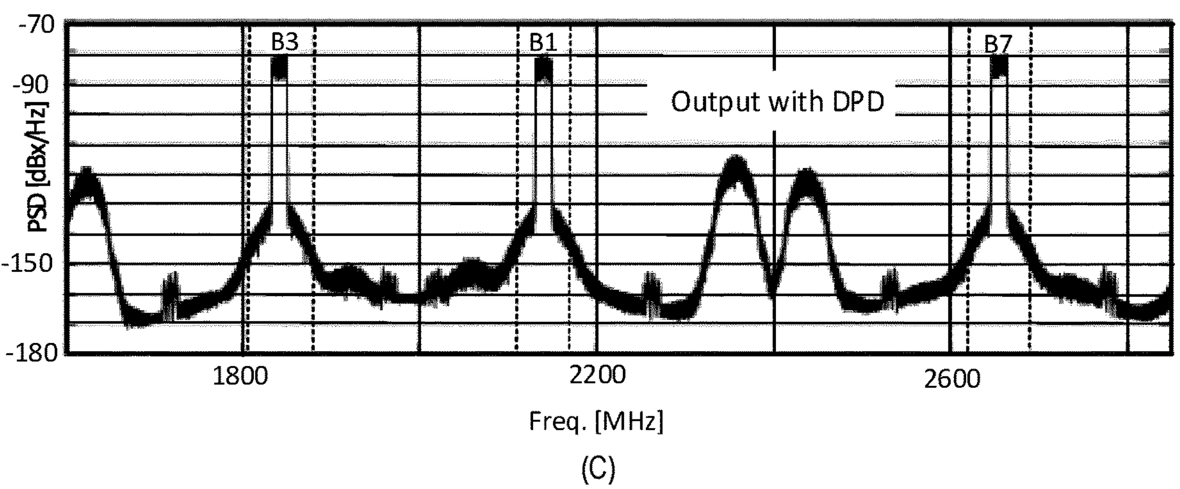
Figure 9A:
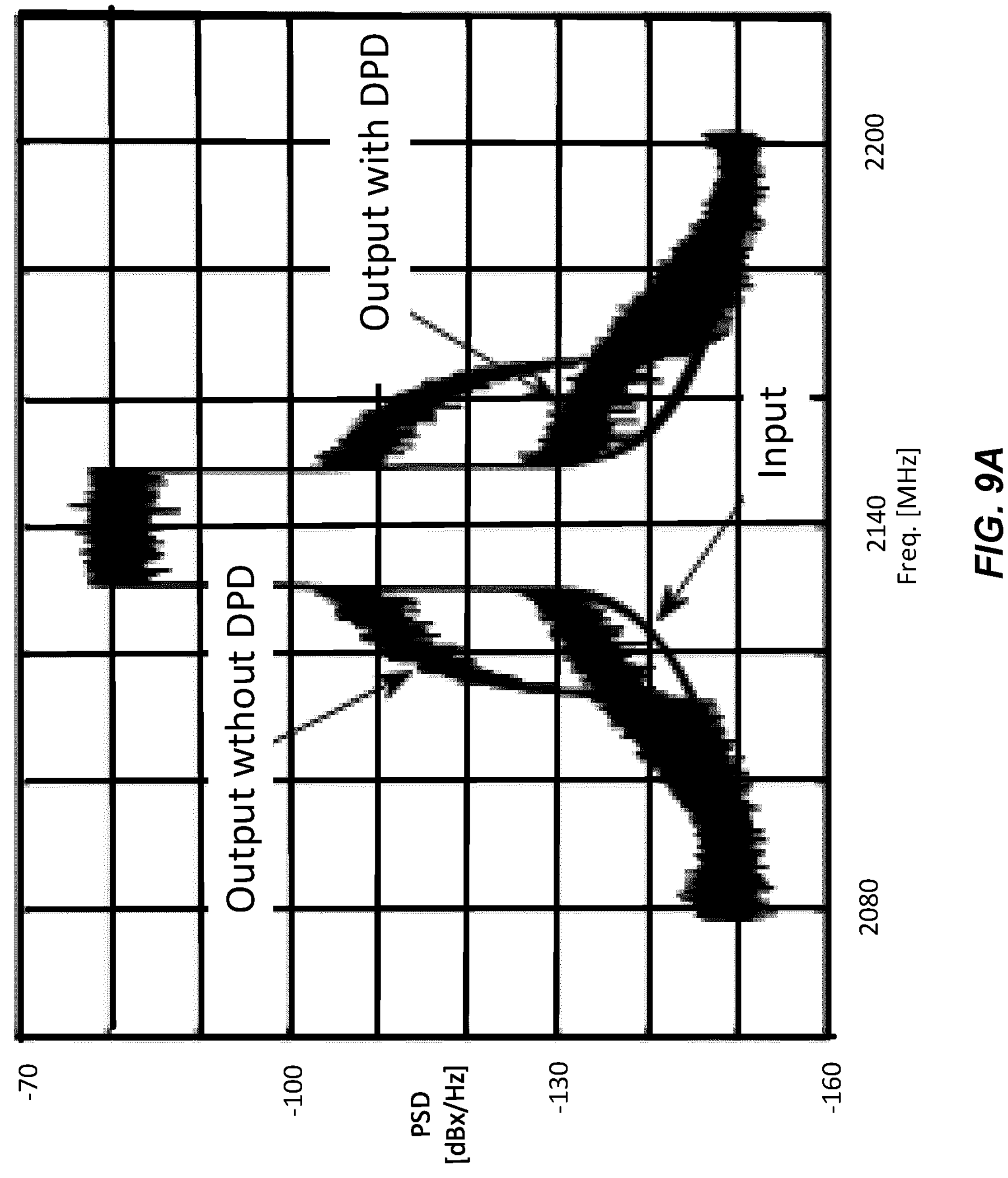
FIGS. 9A through 9C illustrate an input and output spectrum both before and after applying Kernel regression DPD around each individual carrier located in bands B1, B3, and B7, respectively, according to some embodiments of the present disclosure.
Figure 9B:
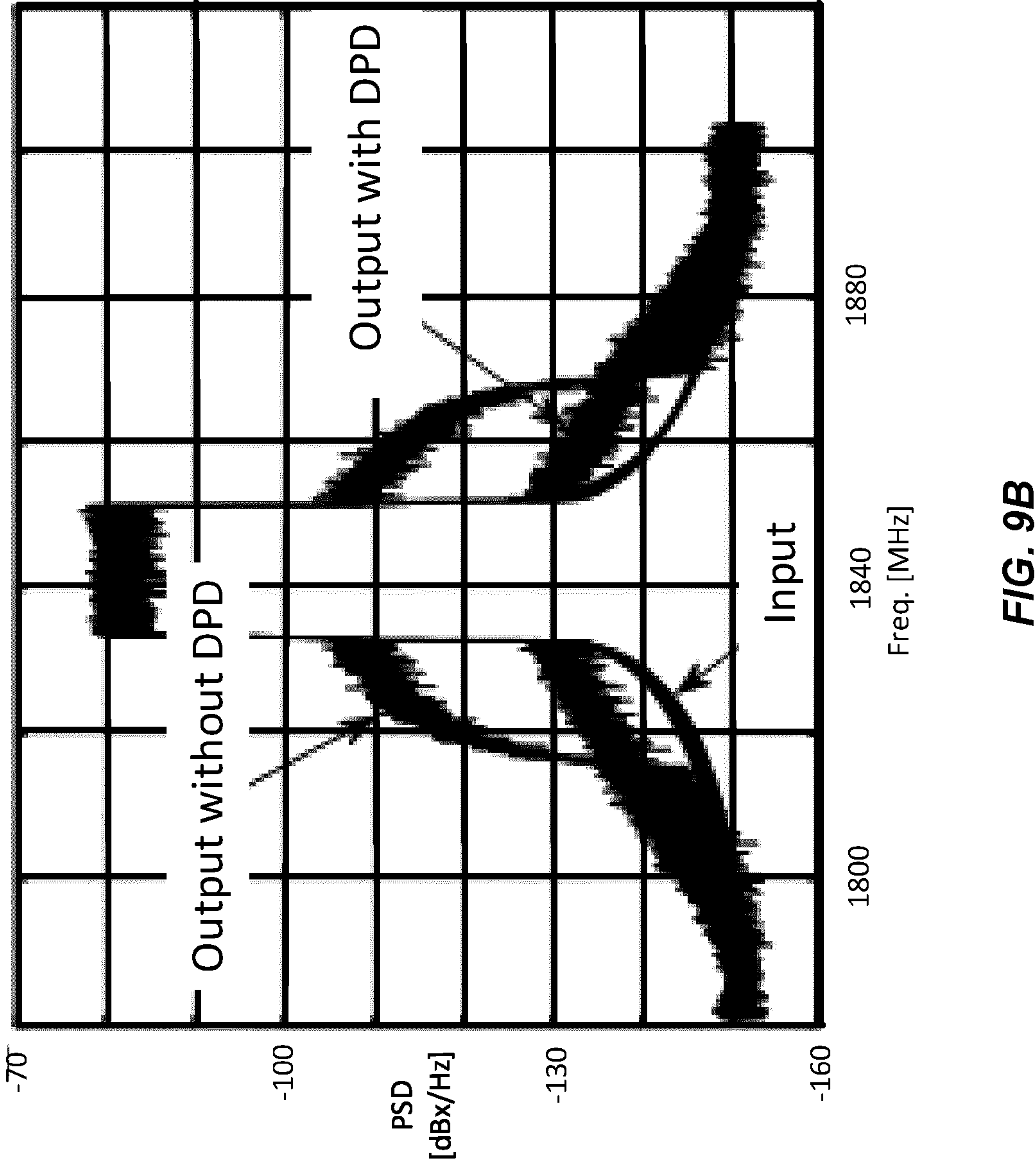
Figure 9C:
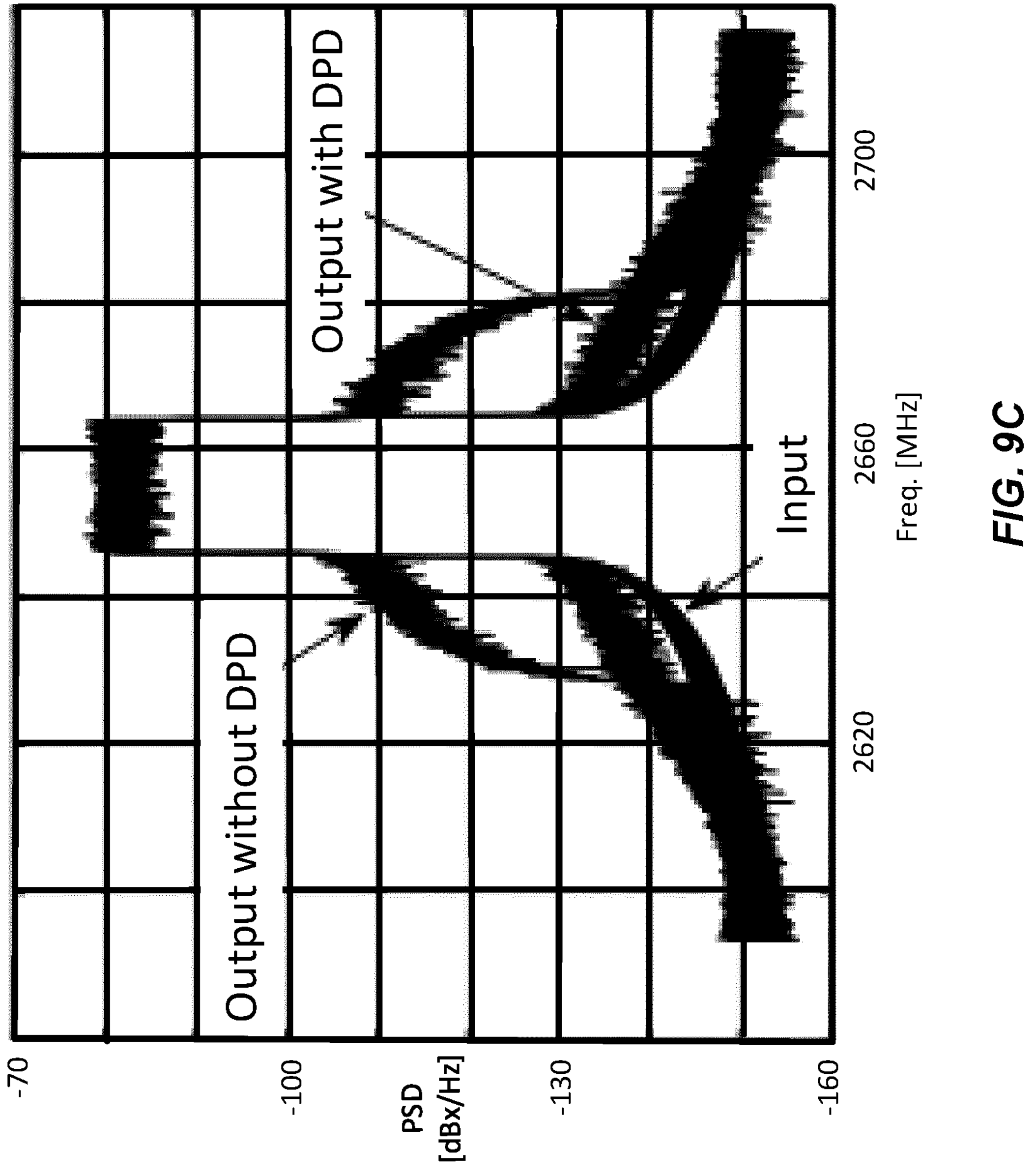

Another important aspect of the kernel Regression based DPD is the performance of linearization in terms of ACLR and NMSE. Since RBF kernel centroids are found using K-means clustering realized by the Lloyd algorithm, then RBF kernel regression based DPD performance is affected by the performance of the Lloyd algorithm in terms of the optimality of centroids locations. As such, K-mean clustering is a non-convex NP hard problem and therefore the Lloyd algorithm finds a local minimum of centroids locations from a set of local minima every time it runs. To realize such behavioral influence of RBF kernel regression based DPD performance, Cumulative Distribution Functions (CDFs) of both ACLR and NMSE for each of the three carriers in the three bands being used have been found as in FIG. 8 and FIG. 9 respectively. The curves of FIG. 8 and FIG. 9 are generated using 100 realization. The curves of FIG. 8 and FIG. 9 are to be compared with the performance limits shown in Table 2. Part A of FIG. 8 illustrates the input signal while parts B and C illustrate the output without and with DPD, respectively. FIGS. 9A through 9C illustrate an input and output spectrum both before and after applying Kernel regression DPD around each individual carrier located in bands B1, B3, and B7, respectively.

In some embodiments, performance of both ACLR and NMSE can be increased by carrying out the K-means clustering offline and selecting the centroid locations set that gives the lowest ACLR and NMSE or to apply such procedure in a fine tune phase. Some example ACLR and NMSE are shown in Table 2:

TABLE 2

| Output before Linearization, linearized output and ILC limits of ACLR and NMSE | | | | |
|---|---|---|---|---|
| | | Output before Linearization | Best Linearized output | ILC limit |
| ACLR [dBc] | B1 | −31.2 | −53.7 | −55.9 |
| | B3 | −30.8 | −52.9 | −57.0 |
| | B7 | −31.4 | −54.5 | −57.1 |
| NMSE [dB] | B1 | −22.2 | −43.3 | −58.9 |
| | B3 | −22.2 | −43.5 | −59.1 |
| | B7 | −22.8 | −44.0 | −58.8 |

Figure 10:
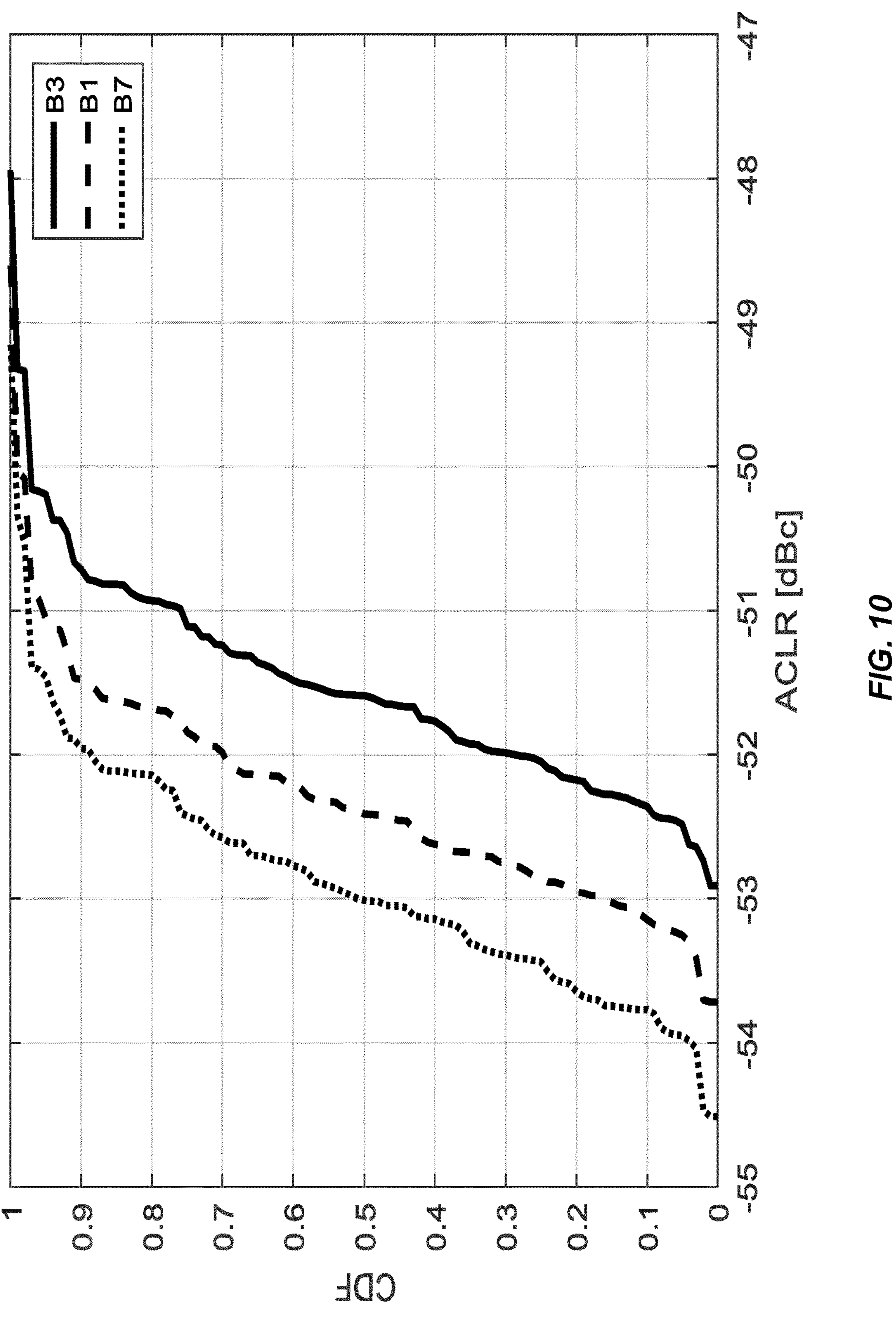
FIG. 10 illustrates a Cumulative Distribution Function (CDF) of Adjacent Channel Leakage Ratio (ACLR) for the three carriers located in Bands B1, B3, and B7, according to some embodiments of the present disclosure.
Figure 11:
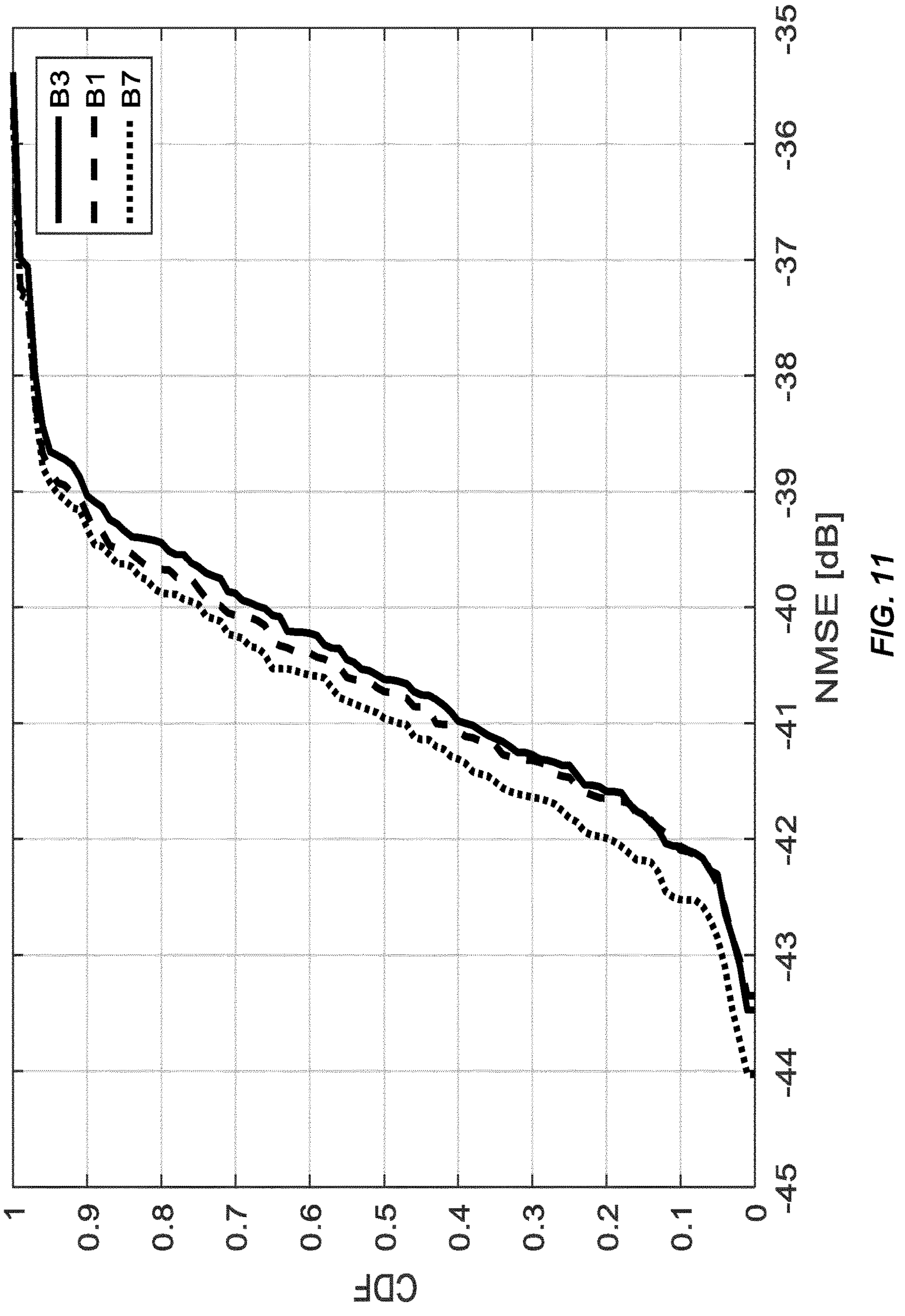
FIG. 11 illustrates a CDF of Normalized Mean Square Error (NMSE) for the three carriers located in Bands B1, B3 and B7, according to some embodiments of the present disclosure.

FIG. 10 illustrates the CDF of ACLR for the three carriers located in Bands B1, B3 and B7. FIG. 11 illustrates the CDF of NMSE for the three carriers located in Bands B1, B3 and B7.

Figure 12:
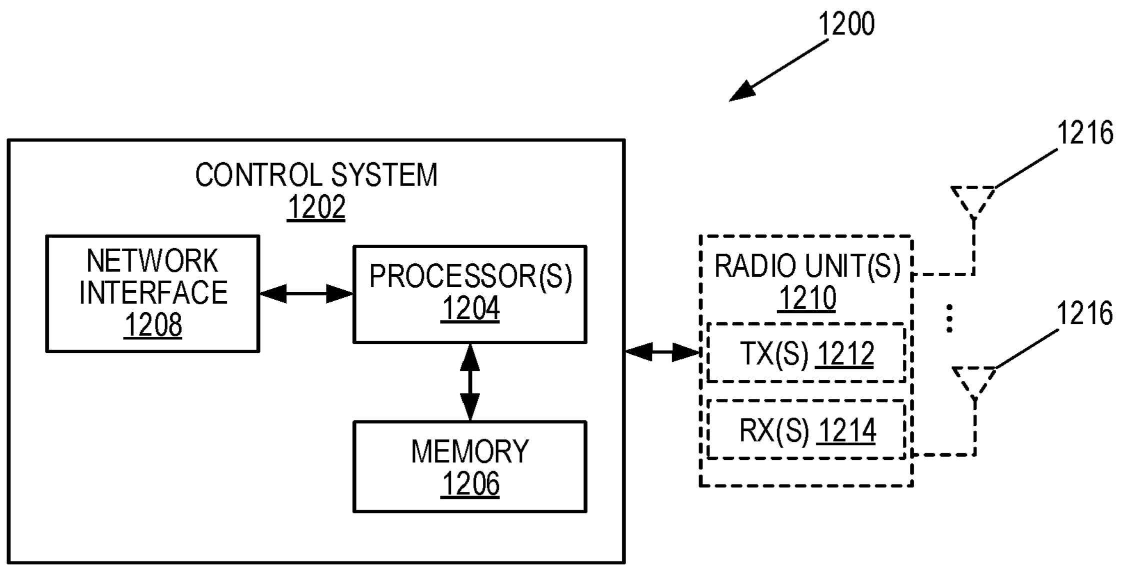
FIG. 12 is a schematic block diagram of a radio access node according to some embodiments of the present disclosure.

FIG. 12 is a schematic block diagram of a radio access node 1200 according to some embodiments of the present disclosure. Optional features are represented by dashed boxes. The radio access node 1200 may be, for example, a base station 102 or 106 or a network node that implements all or part of the functionality of the base station 102 or gNB described herein. As illustrated, the radio access node 1200 includes a control system 1202 that includes one or more processors 1204 (e.g., Central Processing Units (CPUs), Application Specific Integrated Circuits (ASICs), Field Programmable Gate Arrays (FPGAs), and/or the like), memory 1206, and a network interface 1208. The one or more processors 1204 are also referred to herein as processing circuitry. In addition, the radio access node 1200 may include one or more radio units 1210 that each includes one or more transmitters 1212 and one or more receivers 1214 coupled to one or more antennas 1216. The radio units 1210 may be referred to or be part of radio interface circuitry. In some embodiments, the radio unit(s) 1210 is external to the control system 1202 and connected to the control system 1202 via, e.g., a wired connection (e.g., an optical cable). However, in some other embodiments, the radio unit(s) 1210 and potentially the antenna(s) 1216 are integrated together with the control system 1202. The one or more processors 1204 operate to provide one or more functions of a radio access node 1200 as described herein. In some embodiments, the function(s) are implemented in software that is stored, e.g., in the memory 1206 and executed by the one or more processors 1204.

Figure 13:
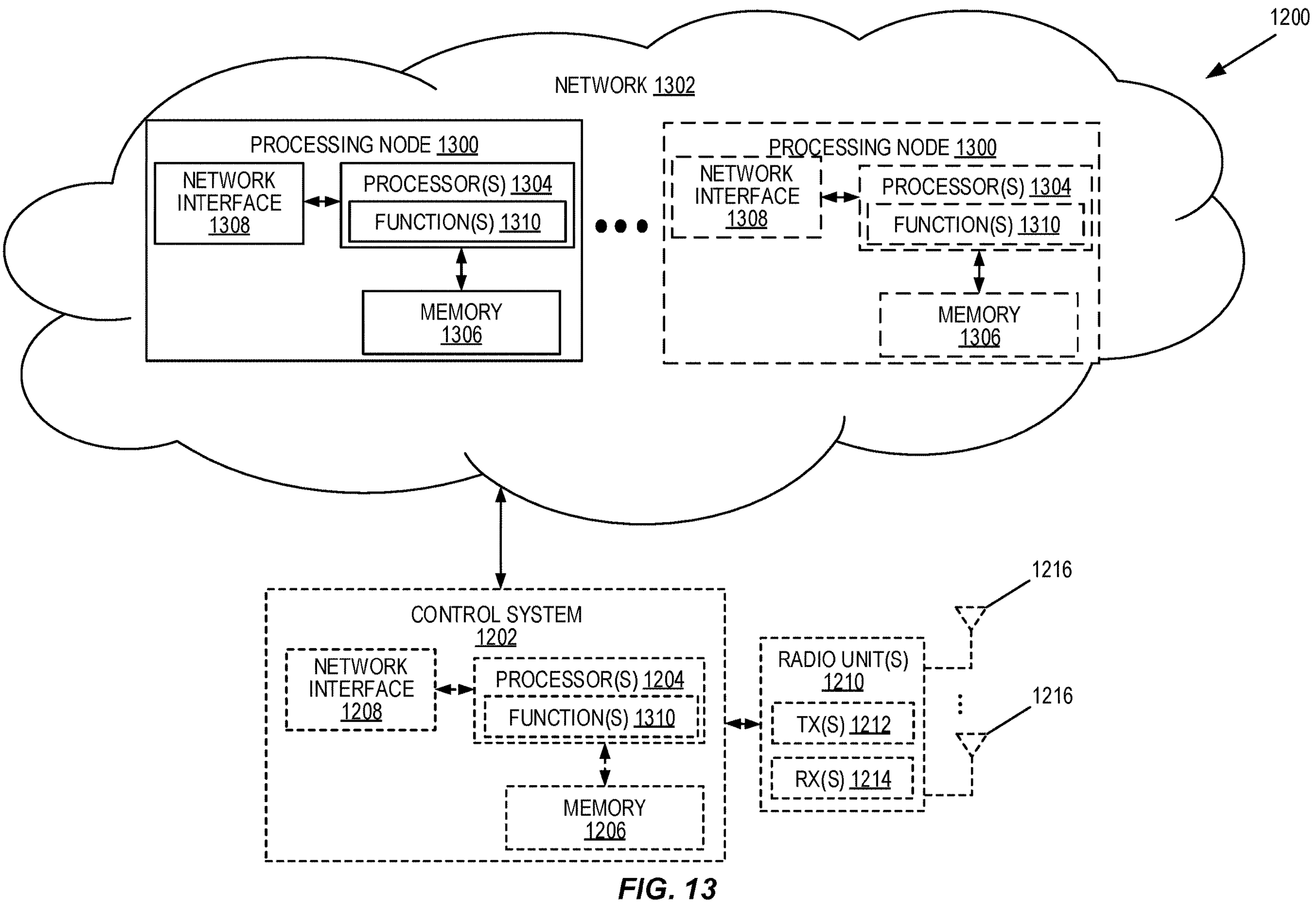
FIG. 13 is a schematic block diagram that illustrates a virtualized embodiment of the radio access node of FIG. 12 according to some embodiments of the present disclosure.

FIG. 13 is a schematic block diagram that illustrates a virtualized embodiment of the radio access node 1200 according to some embodiments of the present disclosure. This discussion is equally applicable to other types of network nodes. Further, other types of network nodes may have similar virtualized architectures. Again, optional features are represented by dashed boxes.

As used herein, a "virtualized" radio access node is an implementation of the radio access node 1200 in which at least a portion of the functionality of the radio access node 1200 is implemented as a virtual component(s) (e.g., via a virtual machine(s) executing on a physical processing node(s) in a network(s)). As illustrated, in this example, the radio access node 1200 may include the control system 1202 and/or the one or more radio units 1210, as described above. The control system 1202 may be connected to the radio unit(s) 1210 via, for example, an optical cable or the like. The radio access node 1200 includes one or more processing nodes 1300 coupled to or included as part of a network(s) 1302. If present, the control system 1202 or the radio unit(s) are connected to the processing node(s) 1300 via the network 1302. Each processing node 1300 includes one or more processors 1304 (e.g., CPUs, ASICs, FPGAs, and/or the like), memory 1306, and a network interface 1308.

In this example, functions 1310 of the radio access node 1200 described herein are implemented at the one or more processing nodes 1300 or distributed across the one or more processing nodes 1300 and the control system 1202 and/or the radio unit(s) 1210 in any desired manner. In some particular embodiments, some or all of the functions 1310 of the radio access node 1200 described herein are implemented as virtual components executed by one or more virtual machines implemented in a virtual environment(s) hosted by the processing node(s) 1300. As will be appreciated by one of ordinary skill in the art, additional signaling or communication between the processing node(s) 1300 and the control system 1202 is used in order to carry out at least some of the desired functions 1310. Notably, in some embodiments, the control system 1202 may not be included, in which case the radio unit(s) 1210 communicate directly with the processing node(s) 1300 via an appropriate network interface(s).

In some embodiments, a computer program including instructions which, when executed by at least one processor, causes the at least one processor to carry out the functionality of radio access node 1200 or a node (e.g., a processing node 1300) implementing one or more of the functions 1310 of the radio access node 1200 in a virtual environment according to any of the embodiments described herein is provided. In some embodiments, a carrier comprising the aforementioned computer program product is provided. The carrier is one of an electronic signal, an optical signal, a radio signal, or a computer readable storage medium (e.g., a non-transitory computer readable medium such as memory).

Figure 14:
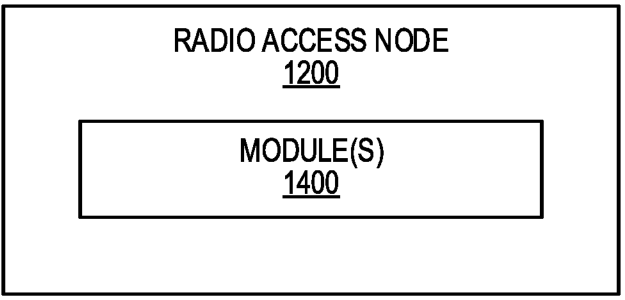
FIG. 14 is a schematic block diagram of the radio access node of FIG. 12 according to some other embodiments of the present disclosure.

FIG. 14 is a schematic block diagram of the radio access node 1200 according to some other embodiments of the present disclosure. The radio access node 1200 includes one or more modules 1400, each of which is implemented in software. The module(s) 1400 provide the functionality of the radio access node 1200 described herein. This discussion is equally applicable to the processing node 1300 of FIG. 13 where the modules 1400 may be implemented at one of the processing nodes 1300 or distributed across multiple processing nodes 1300 and/or distributed across the processing node(s) 1300 and the control system 1202.

Figure 15:
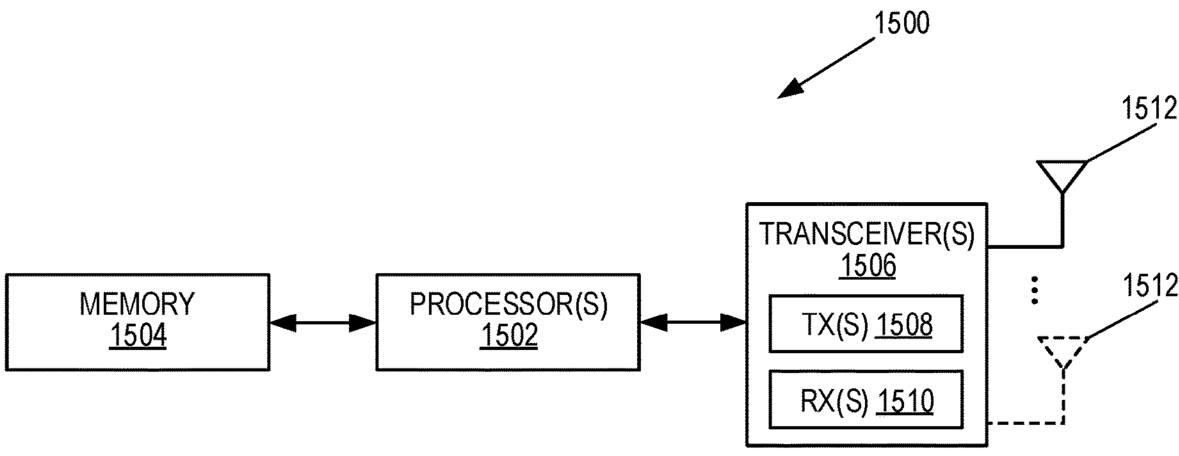
FIG. 15 is a schematic block diagram of a User Equipment device (UE) according to some embodiments of the present disclosure.

FIG. 15 is a schematic block diagram of a wireless communication device 1500 according to some embodiments of the present disclosure. As illustrated, the wireless communication device 1500 includes one or more processors 1502 (e.g., CPUs, ASICs, FPGAs, and/or the like), memory 1504, and one or more transceivers 1506 each including one or more transmitters 1508 and one or more receivers 1510 coupled to one or more antennas 1512. The transceiver(s) 1506 includes radio-front end circuitry connected to the antenna(s) 1512 that is configured to condition signals communicated between the antenna(s) 1512 and the processor(s) 1502, as will be appreciated by on of ordinary skill in the art. The processors 1502 are also referred to herein as processing circuitry. The transceivers 1506 are also referred to herein as radio circuitry. In some embodiments, the functionality of the wireless communication device 1500 described above may be fully or partially implemented in software that is, e.g., stored in the memory 1504 and executed by the processor(s) 1502. Note that the wireless communication device 1500 may include additional components not illustrated in FIG. 15 such as, e.g., one or more user interface components (e.g., an input/output interface including a display, buttons, a touch screen, a microphone, a speaker(s), and/or the like and/or any other components for allowing input of information into the wireless communication device 1500 and/or allowing output of information from the wireless communication device 1500), a power supply (e.g., a battery and associated power circuitry), etc.

In some embodiments, a computer program including instructions which, when executed by at least one processor, causes the at least one processor to carry out the functionality of the wireless communication device 1500 according to any of the embodiments described herein is provided. In some embodiments, a carrier comprising the aforementioned computer program product is provided. The carrier is one of an electronic signal, an optical signal, a radio signal, or a computer readable storage medium (e.g., a non-transitory computer readable medium such as memory).

Figure 16:
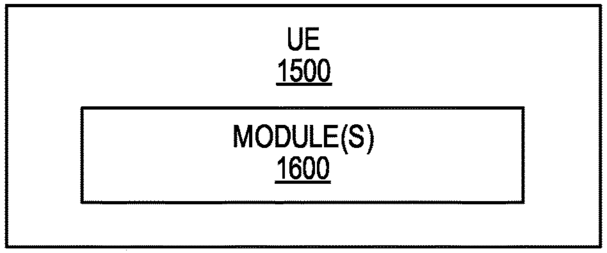
FIG. 16 is a schematic block diagram of the UE of FIG. 15 according to some other embodiments of the present disclosure.

FIG. 16 is a schematic block diagram of the wireless communication device 1500 according to some other embodiments of the present disclosure. The wireless communication device 1500 includes one or more modules 1600, each of which is implemented in software. The module(s) 1600 provide the functionality of the wireless communication device 1500 described herein.

Any appropriate steps, methods, features, functions, or benefits disclosed herein may be performed through one or more functional units or modules of one or more virtual apparatuses. Each virtual apparatus may comprise a number of these functional units. These functional units may be implemented via processing circuitry, which may include one or more microprocessor or microcontrollers, as well as other digital hardware, which may include Digital Signal Processors (DSPs), special-purpose digital logic, and the like. The processing circuitry may be configured to execute program code stored in memory, which may include one or several types of memory such as Read Only Memory (ROM), Random Access Memory (RAM), cache memory, flash memory devices, optical storage devices, etc. Program code stored in memory includes program instructions for executing one or more telecommunications and/or data communications protocols as well as instructions for carrying out one or more of the techniques described herein. In some implementations, the processing circuitry may be used to cause the respective functional unit to perform corresponding functions according one or more embodiments of the present disclosure.

While processes in the figures may show a particular order of operations performed by certain embodiments of the present disclosure, it should be understood that such order is exemplary (e.g., alternative embodiments may perform the operations in a different order, combine certain operations, overlap certain operations, etc.).

At least some of the following abbreviations may be used in this disclosure. If there is an inconsistency between abbreviations, preference should be given to how it is used above. If listed multiple times below, the first listing should be preferred over any subsequent listing(s).

| | |
|---|---|
| 3GPP | Third Generation Partnership Project |
| 5G | Fifth Generation |
| 5GC | Fifth Generation Core |
| 5GS | Fifth Generation System |
| AF | Application Function |
| AMF | Access and Mobility Function |
| AN | Access Network |
| AP | Access Point |
| ASIC | Application Specific Integrated Circuit |
| AUSF | Authentication Server Function |
| CPU | Central Processing Unit |
| DN | Data Network |
| DSP | Digital Signal Processor |
| eNB | Enhanced or Evolved Node B |
| EPS | Evolved Packet System |
| E-UTRA | Evolved Universal Terrestrial Radio Access |
| FPGA | Field Programmable Gate Array |
| gNB | New Radio Base Station |
| gNB-DU | New Radio Base Station Distributed Unit |
| HSS | Home Subscriber Server |
| IoT | Internet of Things |
| IP | Internet Protocol |
| LTE | Long Term Evolution |
| MME | Mobility Management Entity |
| MTC | Machine Type Communication |
| NEF | Network Exposure Function |
| NF | Network Function |
| NR | New Radio |
| NRF | Network Function Repository Function |
| NSSF | Network Slice Selection Function |
| OTT | Over-the-Top |
| PC | Personal Computer |

-continued

| | |
|---|---|
| PCF | Policy Control Function |
| P-GW | Packet Data Network Gateway |
| QoS | Quality of Service |
| RAM | Random Access Memory |
| RAN | Radio Access Network |
| ROM | Read Only Memory |
| RRH | Remote Radio Head |
| RTT | Round Trip Time |
| SCEF | Service Capability Exposure Function |
| SMF | Session Management Function |
| TCI | Transmission Configuration Indicator |
| TRP | Transmission/Reception Point |
| UDM | Unified Data Management |
| UE | User Equipment |
| UPF | User Plane Function |

Those skilled in the art will recognize improvements and modifications to the embodiments of the present disclosure. All such improvements and modifications are considered within the scope of the concepts disclosed herein.

The invention claimed is:

1. A method of linearizing a multiband transmitter, comprising:

for each band of a plurality of bands of the multiband transmitter:

transforming a group of input signals from one or more bands of the plurality of bands into a constructed input vector space to provide transformed input signals;

predistorting the transformed input signals to provide a respective group of predistorted input signals based on a determined plurality of kernel centroid locations, a determined plurality of kernel centroid widths, and a determined plurality of kernel centroid weights in accordance with a Radial Basis Function, RBF, kernel regression; and transmitting the respective group of predistorted input signals;

wherein predistorting the transformed input signals to provide the respective group of predistorted input signals in accordance with the RBF kernel regression comprises: predistorting the transformed input signals to provide the respective group of predistorted input signals in accordance with the RBF kernel regression using a one dimensional, 1D, Lookup Table, LUT.

2. The method of claim 1, further comprising:

for each band of the plurality of bands of the multiband transmitter, prior to transforming the group of input signals:

constructing the input vector space using signals from the one or more bands of the plurality of bands;

determining the plurality of kernel centroid locations, $\mu_c$, c: 1, . . . , C, for the RBF kernel regression in the constructed input vector space;

determining the plurality of kernel centroid widths, $\gamma_c$, c: 1, . . . , C, for the RBF kernel regression in the constructed input vector space; and determining the plurality of kernel centroid weights, $\omega_c$, c: 1, . . . , C, for the RBF kernel regression in the constructed input vector space.

3. The method of claim 2 wherein constructing the input vector space comprises: constructing the input vector space using the signals from the one or more bands of the plurality of bands from signals that contribute to generating nonlinear distortion with a linearization bandwidth around that band.

4. The method of claim 2 wherein constructing the input vector space comprises: constructing the input vector space using signals from the one or more bands of the plurality of bands where memory effects are handled by including tapped delayed signals in the constructed input vector space.

5. The method of claim 2 wherein determining the plurality of kernel centroid locations comprises: identifying the plurality of kernel centroid locations using K-means clustering.

6. The method of claim 2 wherein determining the plurality of kernel centroid locations comprises: determining the plurality of kernel centroid locations offline and then selecting best centroids in terms of one or more of the group consisting of: Adjacent Channel Leakage Ratio, ACLR, Normalized Mean Square Error, NMSE, Operating Band Unwanted Emission, OBUE, distance to spectral mask, and IM.

7. The method of claim 2 wherein determining the plurality of kernel centroid widths, $\gamma_c$, c: 1, . . . , C, comprises determining the plurality of kernel centroid widths, $\gamma_c$, c: 1, . . . , C, for the RBF kernel regression to each be equal to one.

8. The method of claim 1 wherein the RBF kernel regression comprises Gaussian RBFs.

9. The method of claim 1 wherein the RBF kernel regression comprises one of the group consisting of: inverse quadratic RBFs and triangular RBFs.

10. A multiband transmitter, comprising:

one or more antenna branches comprising a respective one or more power amplifiers coupled to a respective one or more antenna elements; and a plurality of Digital Predistortion, DPD, systems operable to, for each band of a plurality of bands of the multiband transmitter:

transform a group of input signals from one or more bands of the plurality of bands into a constructed input vector space to provide transformed input signals; and predistort the transformed input signals to provide a corresponding group of predistorted input signals based on a determined plurality of kernel centroid locations, a determined plurality of kernel centroid widths, and a determined plurality of kernel centroid weights in accordance with a Radial Basis Function, RBF, kernel regression; and the one or more antenna elements being operable to transmit the group of predistorted input signals;

wherein predistorting the transformed input signals to provide the respective group of predistorted input signals in accordance with the RBF kernel regression comprises: predistorting the transformed input signals to provide the respective group of predistorted input signals in accordance with the RBF kernel regression using a one dimensional, 1D, Lookup Table, LUT.

11. The multiband transmitter of claim 10, wherein:

the one or more DPD systems are further operable to, for each band of the plurality of bands of the multiband transmitter, prior to transforming the group of input signals:

construct the input vector space using signals from one or more bands of the plurality of bands;

determine the plurality of kernel centroid locations, $\mu_c$, c: 1, . . . , C, for the RBF kernel regression in the constructed input vector space;

determine the plurality of kernel centroid widths, $\gamma_c$, c: 1, . . . , C, for the RBF kernel regression in the constructed input vector space; and determine the plurality of kernel centroid weights, $\omega_c$, c: 1, . . . , C, for the RBF kernel regression in the constructed input vector space.

12. The multiband transmitter of claim 11 wherein constructing the input vector space comprises: constructing the input vector space using the signals from the one or more bands of the plurality of bands from signals that contribute to generating non-linear distortion with a linearization bandwidth around that band.

13. The multiband transmitter of claim 11 wherein constructing the input vector space comprises: constructing the input vector space using signals from the one or more bands of the plurality of bands where memory effects are handled by including tapped delayed signals in the constructed input vector space.

14. The multiband transmitter of claim 11 wherein determining the plurality of kernel centroid locations comprises: identifying the plurality of kernel centroid locations using K-means clustering.

15. The multiband transmitter of claim 11 wherein determining the plurality of kernel centroid locations comprises: determining the plurality of kernel centroid locations offline and then selecting best centroids in terms of one or more of the group consisting of: Adjacent Channel Leakage Ratio, ACLR, Normalized Mean Square Error, NMSE, Operating Band Unwanted Emission, OBUE, distance to spectral mask, and IM.

16. The multiband transmitter of claim 11 wherein determining the plurality of kernel centroid widths, $\gamma_c$, c: 1, . . . , C, comprises determining the plurality of kernel centroid widths, $\gamma_c$, c: 1, . . . , C, for the RBF kernel regression to each be equal to one.

17. A wireless node comprising a multiband transmitter, the multiband transmitter comprising:

one or more antenna branches comprising a respective one or more power amplifiers coupled to a respective one or more antenna elements; and a plurality of Digital Predistortion, DPD, systems operable to, for each band of a plurality of bands of the multiband transmitter:

transform a group of input signals from one or more bands of the plurality of bands into a constructed input vector space to provide transformed input signals; and predistort the transformed input signals to provide a corresponding group of predistorted input signals based on a determined plurality of kernel centroid locations, a determined plurality of kernel centroid widths, and a determined plurality of kernel centroid weights in accordance with a Radial Basis Function, RBF, kernel regression; and the one or more antenna elements being operable to transmit the group of predistorted input signals;

wherein predistorting the transformed input signals to provide the respective group of predistorted input signals in accordance with the RBF kernel regression comprises: predistorting the transformed input signals to provide the respective group of predistorted input signals in accordance with the RBF kernel regression using a one dimensional, 1D, Lookup Table, LUT.

18. The wireless node of claim 17 wherein the wireless node is a base station.

19. The wireless node of claim 17 wherein the wireless node is a wireless device.

* * * * *